(12) United States Patent
Kim et al.

(10) Patent No.: US 11,277,915 B2
(45) Date of Patent: Mar. 15, 2022

(54) ANTENNA DEVICE AND ELECTRONIC DEVICE INCLUDING THE SAME

(71) Applicant: Samsung Electronics Co., Ltd., Suwon-si, Gyeonggi-do (KR)

(72) Inventors: Minki Kim, Suwon-si (KR); Chulwoo Park, Suwon-si (KR); Dongil Son, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/384,257

(22) Filed: Apr. 15, 2019

(65) Prior Publication Data

US 2019/0327834 A1 Oct. 24, 2019

(30) Foreign Application Priority Data

Apr. 23, 2018 (KR) .......................... 10-2018-0046889

(51) Int. Cl.
*H05K 1/14* (2006.01)
*H01Q 1/08* (2006.01)
(Continued)

(52) U.S. Cl.
CPC ............ *H05K 1/148* (2013.01); *H01Q 1/085* (2013.01); *H01Q 1/2291* (2013.01);
(Continued)

(58) Field of Classification Search
CPC .... H05K 1/148; H05K 1/0237; H05K 1/0243; H05K 2201/10098; H05K 2201/042;
(Continued)

(56) References Cited

U.S. PATENT DOCUMENTS 10,727,568 B2 * 7/2020 Cho ..................... H01R 12/79
2010/0240327 A1 9/2010 Lambrecht et al.
(Continued)

FOREIGN PATENT DOCUMENTS

EP 3 725 065 A1 10/2020
KR 10-2008-0029054 A 4/2005
(Continued)

OTHER PUBLICATIONS

International Search Report dated Jul. 23, 2019, issued in the International Application No. PCT/KR2019/004525.
(Continued)

*Primary Examiner* — Don P Le
(74) *Attorney, Agent, or Firm* — Jefferson IP Law, LLP

(57) ABSTRACT

An antenna device and an electronic device including the same are provided. The antenna device includes a housing that includes a first plate, a second plate facing a direction opposite to the first plate, and a side member surrounding a space between the first plate and the second plate, a display viewable through at least a portion of the first plate, an antenna assembly disposed within the housing wherein the antenna assembly includes a first printed circuit board, a second printed circuit board, at least one structure interconnecting the first printed circuit board and the second printed circuit board and including conductive paths, a plurality of conductive patterns, and a wireless communication circuit, a flexible printed circuit board, and a third printed circuit board.

7 Claims, 26 Drawing Sheets

(51) Int. Cl.
*H01Q 1/24* (2006.01)
*H01Q 1/22* (2006.01)
*H05K 1/02* (2006.01)

(52) U.S. Cl.
CPC ............. *H01Q 1/243* (2013.01); *H01Q 1/245* (2013.01); *H05K 1/0237* (2013.01)

(58) Field of Classification Search
CPC ........ H05K 1/147; H01Q 1/085; H01Q 1/245; H01Q 1/243; H01Q 1/2291; H01Q 21/065; H01Q 9/0407; H01Q 9/065; H01Q 21/28; H01Q 21/08; H01Q 25/00; H01Q 1/38
USPC .......................................... 343/893
See application file for complete search history.

(56) References Cited

U.S. PATENT DOCUMENTS

| | | | |
|---|---|---|---|
| 2013/0050056 A1 | 2/2013 | Lee et al. | |
| 2013/0078915 A1* | 3/2013 | Zhao | H04B 1/40 455/41.1 |
| 2015/0116156 A1 | 4/2015 | Chen et al. | |
| 2016/0095207 A1 | 3/2016 | Taniguchi et al. | |
| 2016/0234949 A1* | 8/2016 | Seo | H05K 5/03 |
| 2017/0194703 A1 | 7/2017 | Watson | |
| 2017/0207516 A1 | 7/2017 | Koo et al. | |
| 2017/0214121 A1* | 7/2017 | Ganchrow | H01Q 1/2258 |
| 2017/0358847 A1* | 12/2017 | Cho | H01R 12/79 |
| 2018/0041239 A1 | 2/2018 | Youn et al. | |
| 2019/0104212 A1* | 4/2019 | Lee | H01Q 1/2283 |
| 2019/0109362 A1* | 4/2019 | Haroun | H01P 5/087 |
| 2019/0305430 A1* | 10/2019 | Thai | H01Q 21/245 |
| 2019/0319341 A1 | 10/2019 | Park et al. | |
| 2019/0372229 A1* | 12/2019 | Dalmia | H01Q 3/01 |
| 2019/0392283 A1* | 12/2019 | Finn | H01Q 1/38 |
| 2020/0006204 A1* | 1/2020 | Cheah | H05K 1/147 |
| 2020/0015357 A1* | 1/2020 | Kim | H01L 24/20 |
| 2020/0091608 A1* | 3/2020 | Alpman | H01Q 5/47 |
| 2020/0106167 A1* | 4/2020 | Moon | H01Q 1/243 |
| 2020/0106187 A1* | 4/2020 | Ou | H01Q 1/38 |
| 2020/0186180 A1* | 6/2020 | Park | H04B 1/3827 |
| 2020/0191902 A1* | 6/2020 | Herrault | G01S 7/282 |
| 2020/0220572 A1* | 7/2020 | Kwon | H01Q 21/0025 |

FOREIGN PATENT DOCUMENTS

KR 10-2009-0093522 A 9/2009
KR 10-2010-0061499 A 6/2010

OTHER PUBLICATIONS

European Search Report dated Mar. 5, 2021, issued in European Application No. 19792477.2.

* cited by examiner

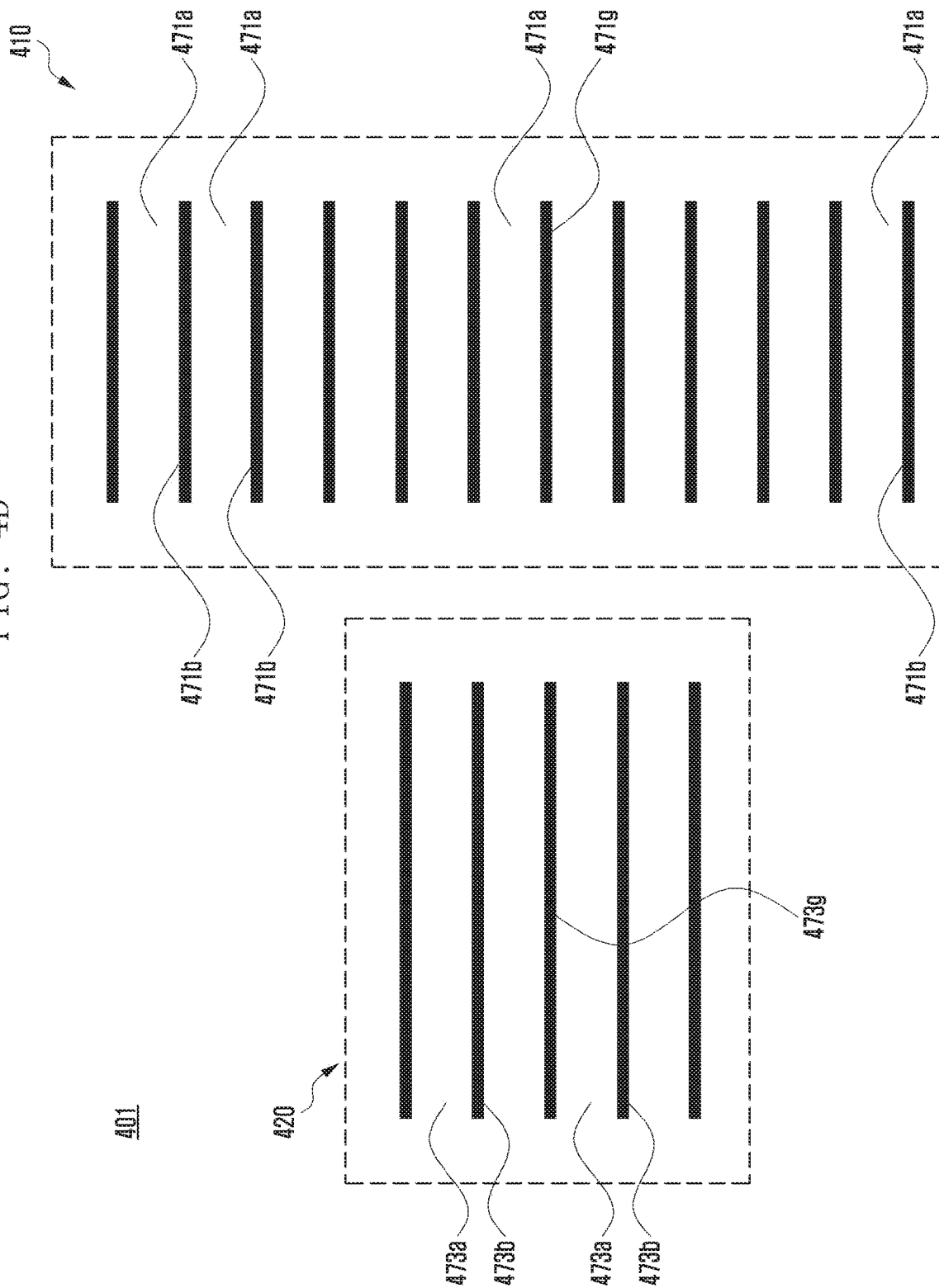

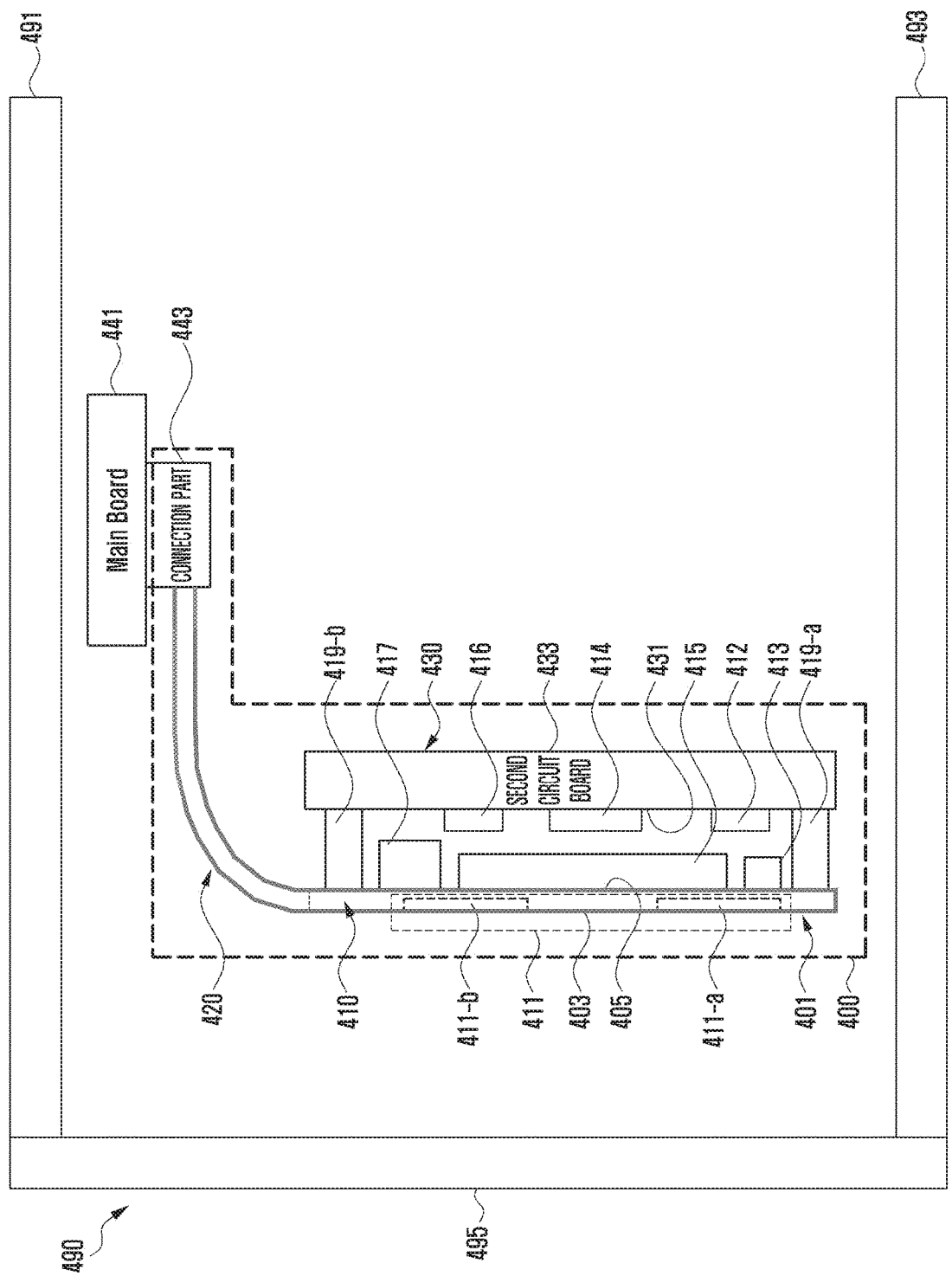

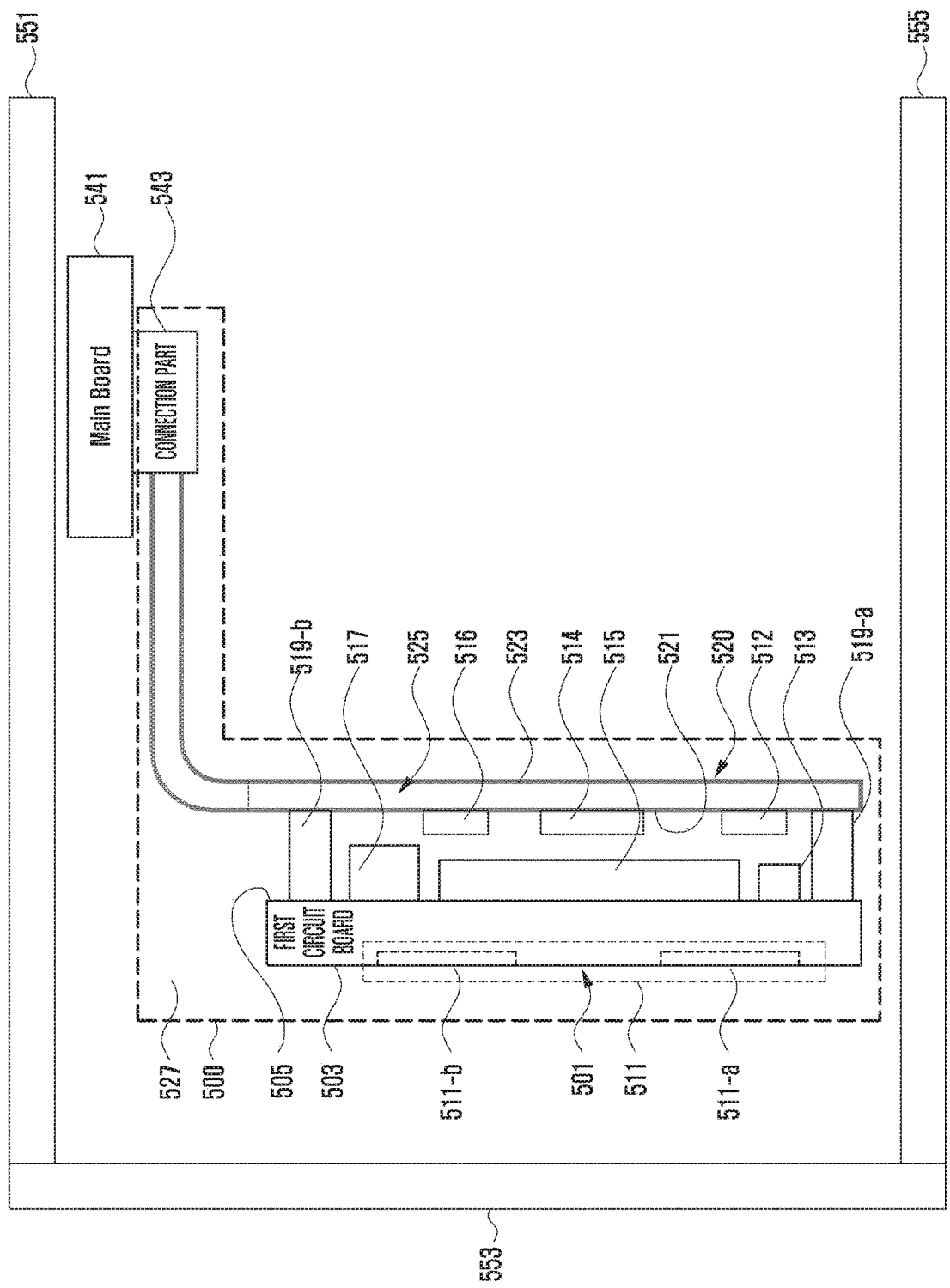

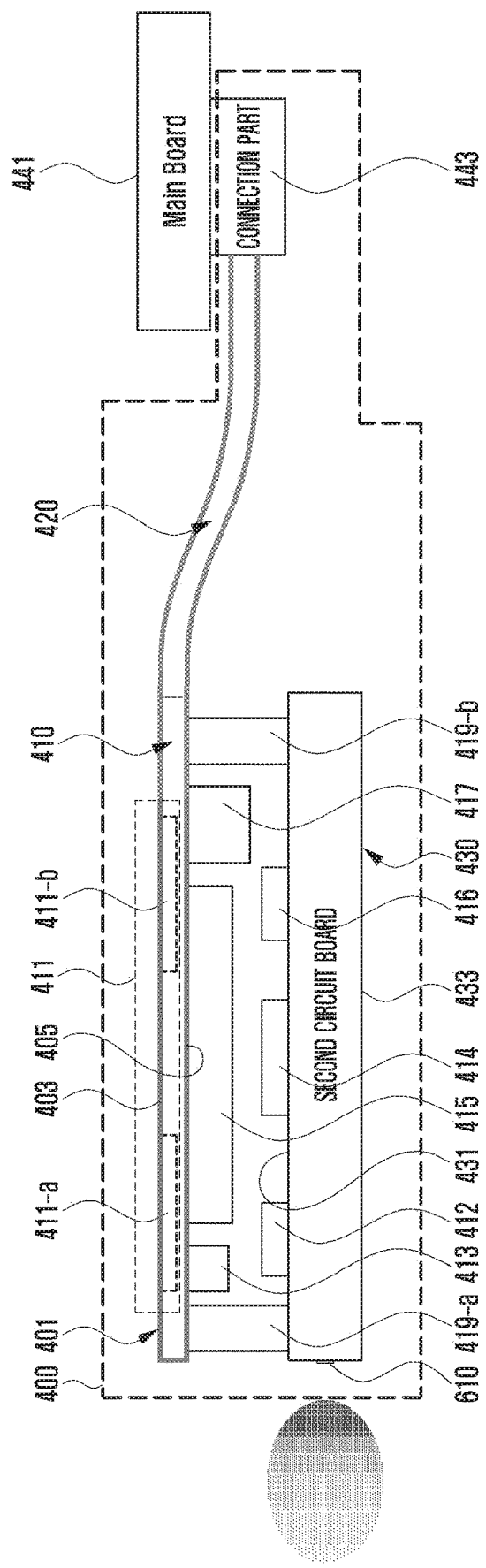

ANTENNA DEVICE AND ELECTRONIC DEVICE INCLUDING THE SAME

CROSS-REFERENCE TO RELATED APPLICATION(S)

This application is based on and claims priority under 35 U.S.C. § 119(a) of a Korean patent application number 10-2018-0046889, filed on Apr. 23, 2018, in the Korean Intellectual Property Office, the disclosure of which is incorporated by reference herein in its entirety.

BACKGROUND

1. Field

The disclosure relates to an antenna device and an electronic device including the same. More particularly, the disclosure relates to an electronic device capable of including an antenna device by using a rigid flexible printed circuit board (RFPCB) having flexible and rigid areas.

2. Description of the Related Art

Various electronic devices can transmit and receive a variety of data through a wireless communication system. Recently, efforts have been made to implement a wireless communication system that operates in the mmWave band for a variety of purposes, such as meeting the increasing demand for wireless data traffic or achieving higher data rates.

When a wireless communication system is implemented in the mmWave band, the number of parts included in the antenna device capable of transmitting or receiving signals used for radio communication can increase. As the number of included parts increases, the size of the antenna device can increase and the space occupied by the antenna device inside an electronic device can also increase.

The antenna device may be electrically connected to the main board on which the components of the electronic device are mounted. When the antenna device is electrically connected to the main board, the antenna device may include a connection part (board-to-board connector or receptacle) for being electrically connected to the main board.

The antenna device may require a separate mounting space for mounting the connection part and components thereof, increasing the size of the space occupied by the antenna device. A separate connection process may be required for connecting the antenna device and the connection part.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device capable of including an antenna device by using a rigid flexible printed circuit board (RFPCB) having flexible and rigid areas.

Additional aspects will be set forth in part in the description which follows and, in part, will be apparent from the description, or may be learned by practice of the presented embodiments.

In accordance with an aspect of the disclosure, an antenna device is provided. The antenna device includes a housing including a first plate, a second plate facing a direction opposite to the first plate, and a side member surrounding a space between the first plate and the second plate, a display viewable through at least a portion of the first plate, an antenna assembly disposed within the housing wherein the antenna assembly includes a first printed circuit board having a first surface facing a first direction and a second surface facing a second direction opposite to the first direction, a second printed circuit board spaced apart from the first circuit board and having a third surface facing the first direction and facing at least a portion of the second surface and a fourth surface facing the second direction, at least one structure interconnecting the first printed circuit board and the second printed circuit board and including conductive paths, a plurality of conductive patterns formed in at least one of the first surface, the fourth surface, the inside of the first printed circuit board, or the inside of the second printed circuit board, and a wireless communication circuit mounted on at least one of the second surface or the third surface and configured to transmit and receive a signal having a frequency between 3 GHz and 100 GHz, a flexible printed circuit board extended from one end of the first printed circuit board or one end of the second printed circuit board, and a third printed circuit board having a connector electrically connected to the wireless communication circuit through the flexible printed circuit board and disposed between the first plate and the second plate in parallel with the first plate.

In accordance with another aspect of the disclosure, an antenna device and an electronic device are provided. The antenna device and an electronic device includes the same where the electrical connection to the main board is made by using a RFPCB or a hot-bar soldered circuit board to thereby remove the connection part for connecting to the main board.

In the antenna device and an electronic device including the same according to an embodiment of the disclosure, the connection part for connecting to the main board is removed, so that the space occupied by the connection part can be saved and the size of the antenna device can be reduced.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 4D illustrates a layered structure of circuit boards in an electronic device according to an embodiment of the disclosure;

FIG. 4E illustrates an antenna device according to an embodiment of the disclosure;

FIG. 5B illustrates an antenna device according to an embodiment of the disclosure;

FIG. 6A illustrates an antenna pattern being disposed on a side of one of a first circuit board and a second circuit board in an antenna device according to an embodiment of the disclosure;

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
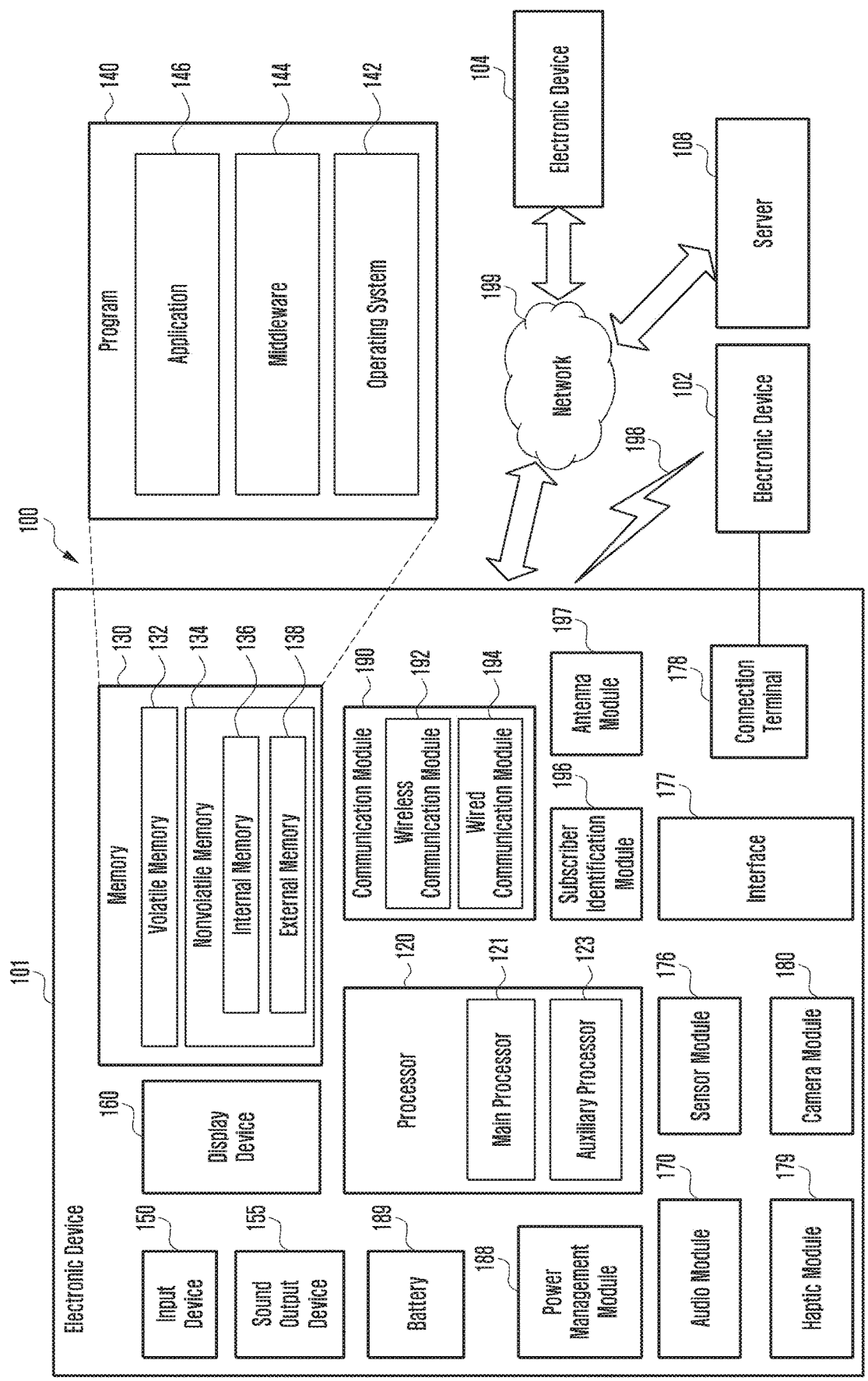
FIG. 1 is a block diagram of an electronic device according to an embodiment of the disclosure.

FIG. 1 is a block diagram of an electronic device according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment of the disclosure, the electronic device 101 may communicate with the electronic device 104 via the server 108. According to an embodiment of the disclosure, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments of the disclosure, at least one (e.g., the display device 160 or the camera module 180) of the components may be omitted from the electronic device 101, or one or more other components may be added in the electronic device 101. In some embodiments of the disclosure, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment of the disclosure, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment of the disclosure, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment of the disclosure, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment of the disclosure, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, ISPs, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. According to an embodiment of the disclosure, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
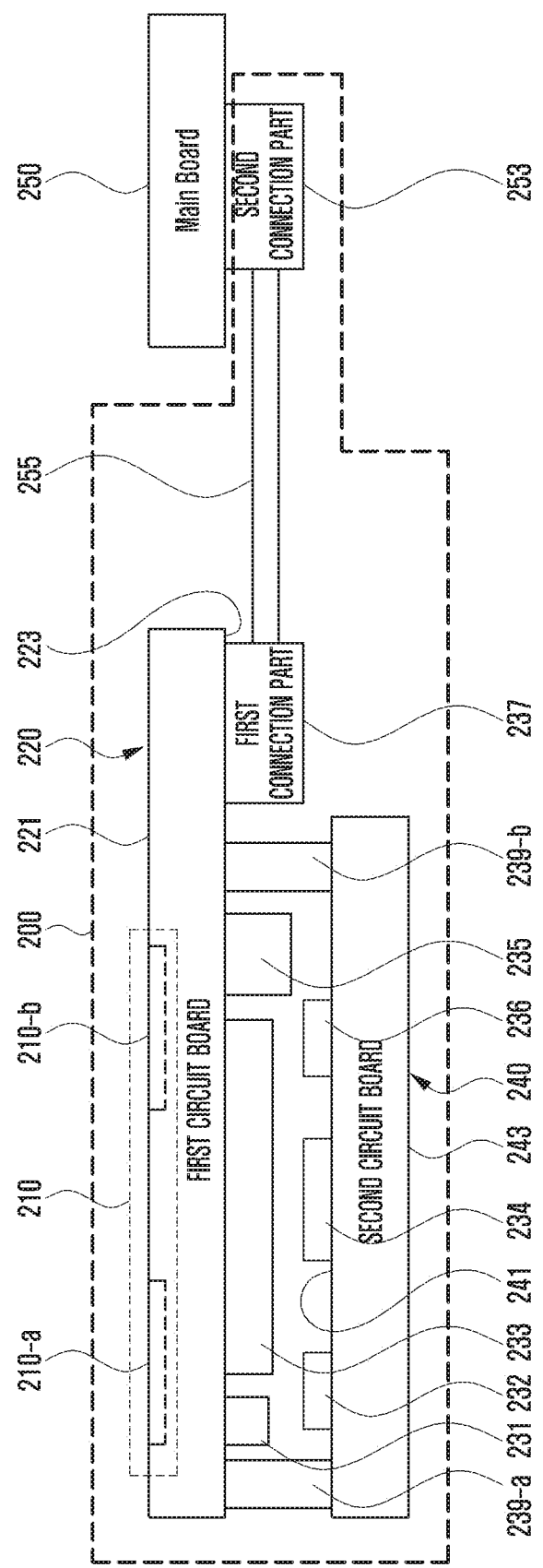
FIG. 2 illustrates an antenna device according to an embodiment of the disclosure.

FIG. 2 illustrates an antenna device according to an embodiment of the disclosure.

Referring to FIG. 2, the antenna device 200 (e.g., antenna module 197 in FIG. 1) according to an embodiment of the disclosure may include a first circuit board 220 and a second circuit board 240.

In various embodiments of the disclosure, the first circuit board 220 may include a first surface 221 on which a first antenna pattern 210-*a* or a second antenna pattern 210-*b* is disposed, and a second surface 223 on which at least one of first plural components 231, 233 and 235 is disposed and facing away from the first surface 221. The first antenna pattern 210-*a* or the second antenna pattern 210-*b* may constitute an antenna array 210. At least one of the first plural components 231, 233 and 235 of the antenna device 200 may be disposed on the second surface 223. For example, the first plural components 231, 233 and 235, such as, a component for applying a signal to the first antenna pattern 210-*a* or the second antenna pattern 210-*b*, a component for receiving a signal received through the first antenna pattern 210-*a* or the second antenna pattern 210-*b*, and a communication circuit 233 for controlling the emission of signals of the first antenna pattern 210-*a* or the second antenna pattern 210-*b*, may be disposed on the second surface 223.

In various embodiments of the disclosure, the antenna patterns 210-*a* and 210-*b* may emit communication signals under the control of a communication module (e.g., communication module 190 in FIG. 1). There may be no restriction on the shape of the antenna patterns 210-*a* and 210-*b*. For example, the first antenna pattern 210-*a* or the second antenna pattern 210-*b* disposed on the first surface 221 may have a variety of shapes in consideration of the radiation efficiency and the position at which the antenna device 200 is to be placed within the electronic device (e.g., the electronic device 101 in FIG. 1).

In various embodiments of the disclosure, the antenna device 200 may include a second circuit board 240 electrically connected to the first circuit board 220 and disposed substantially parallel to the first circuit board 220. The first circuit board 220 may be electrically connected with the second circuit board 220 through at least one interposer 239-*a* or 239-*b* disposed between the first circuit board 220 and the second circuit board 240.

In various embodiments of the disclosure, at least one of second plural components 232, 234 and 236 of the antenna device 200 may be disposed on the third surface 241 or the fourth surface 243 of the second circuit board 240. For example, the second plural components 232, 234 and 236, such as a component for controlling power of the first antenna pattern 210-*a* or the second antenna pattern 210-*b*, a component for applying a signal to the first antenna pattern 210-*a* or the second antenna pattern 210-*b*, a component for receiving a signal received through the first antenna pattern 210-*a* or the second antenna pattern 210-*b*, and a communication circuit for controlling the emission of signals of the first antenna pattern 210-*a* or the second antenna pattern 210-*b*, may be disposed on the third surface 241 or the fourth surface 243.

In various embodiments of the disclosure, the antenna device 200 may be connected to the main board 250 on which the components of the electronic device 101 are disposed. The antenna device 200 may be electrically connected to the main board 250, and may radiate signals used for various communications according to the control of a control circuit (e.g., communication module 190 or processor 120 in FIG. 1) disposed on the main board 250. To this end, the antenna device 200 may include a first connection part 237 that can be connected to the main board 250. The main board 250 may include a second connection part 253 for connection with the antenna device 200. The first connection part 237 of the antenna device 200 and the second connection part 253 of the main board 250 may be electrically connected to each other through a connection member 255 (e.g., cable, or flexible printed circuit board).

In various embodiments of the disclosure, the first connection portion 237 may also be disposed on the second surface 223 of the first circuit board 220 or on the third surface 241 of the second circuit board 240.

Figure 3:
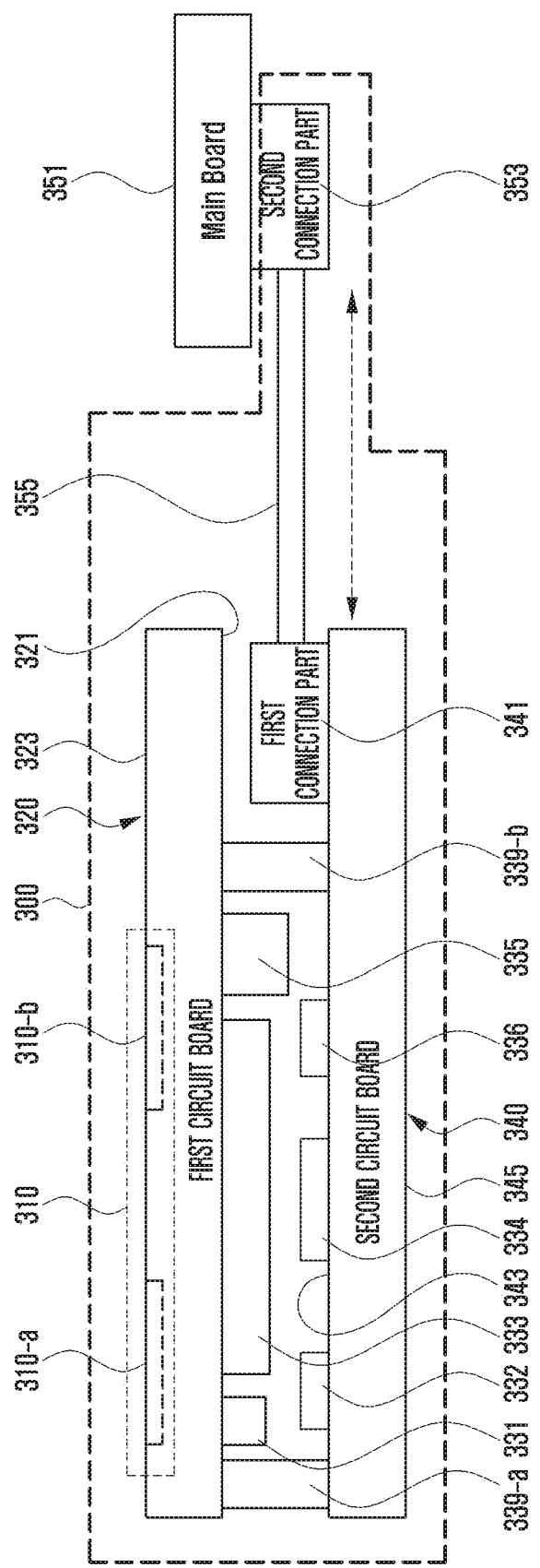
FIG. 3 illustrates an antenna device according to an embodiment of the disclosure.

FIG. 3 illustrates an antenna device according to an embodiment of the disclosure.

Referring to FIG. 3, an antenna device 300 (e.g., antenna module 197 in FIG. 1) according to an embodiments of the disclosure may include a first circuit board 330 or a second circuit board 340. The structure identical to that of the antenna device 200 shown in FIG. 2 will not be described for clarity.

In various embodiments of the disclosure, the first circuit board 330 (e.g., first circuit board 220 in FIG. 2) may include a first surface 323 (e.g., first surface 221 in FIG. 2) on which antenna patterns 310-*a* and 310-*b* (e.g., antenna patterns 210-*a* and 210-*b* in FIG. 2) are disposed, and a second surface 321 (e.g., second surface 223 of FIG. 2) on which at least one of first plural components 331, 333 and 335 (e.g., first plural components 231, 233 and 235 in FIG. 2) constituting the antenna device 300 is disposed and facing away from the first surface 323. The first antenna pattern 310-*a* and the second antenna pattern 310-*b* may constitute an antenna array 310.

In various embodiments of the disclosure, the antenna device 300 may include a second circuit board 340 (e.g., second circuit board 240 in FIG. 2) electrically connected to the first circuit board 320 and disposed substantially parallel to the first circuit board 320. The first circuit board 320 may be electrically connected with the second circuit board 340 through at least one interposer 339-*a* or 339-*b* (e.g., interposers 239-*a* and 239-*b* in FIG. 2) disposed between the first circuit board 320 and the second circuit board 340.

In various embodiments of the disclosure, at least one of second plural components 332, 334 and 336 (e.g., second plural components 232, 234 and 236 in FIG. 2) of the antenna device 300 may be disposed on the third surface 343 or the fourth surface 345 of the second circuit board 340. For example, the second plural components 332, 334 and 336, such as a component for controlling power of the first antenna pattern 310-*a* or the second antenna pattern 310-*b*, a component for applying a signal to the first antenna pattern 310-*a* or the second antenna pattern 310-*b*, a component for receiving a signal received through the first antenna pattern 310-*a* or the second antenna pattern 310-*b*, and a communication circuit for controlling the emission of signals of the first antenna pattern 310-*a* or the second antenna pattern 310-*b*, may be disposed on the third surface 343 or on the fourth surface 345.

In various embodiments of the disclosure, the antenna device 300 may be connected to the main board 351 (e.g., the main board 250 in FIG. 2) on which the components of the electronic device 101 are disposed. To this end, the antenna device 300 may include a first connection part 341 that can be connected to the main board 351. The main board 351 may include a second connection part 353 (e.g., second connection part 253 in FIG. 2) for connection with the antenna device 300. The first connection part 341 of the antenna device 300 and the second connection part 353 of the main board 351 may be electrically connected through a connection member 355 (e.g., cable, or flexible printed circuit board).

In various embodiments of the disclosure, the first connection part 353 may be disposed on an upper section of the second circuit board 340.

In the embodiment shown in FIG. 2 or 3, the antenna device and the main board can be electrically connected by connecting the connection part of the antenna device (e.g., antenna device 200 in FIG. 2 or antenna device 300 in FIG. 3) to the connection part of the main board. The connection part may be implemented by using a board-to-board (b-to-b) connector or a receptacle.

Figure 4A:
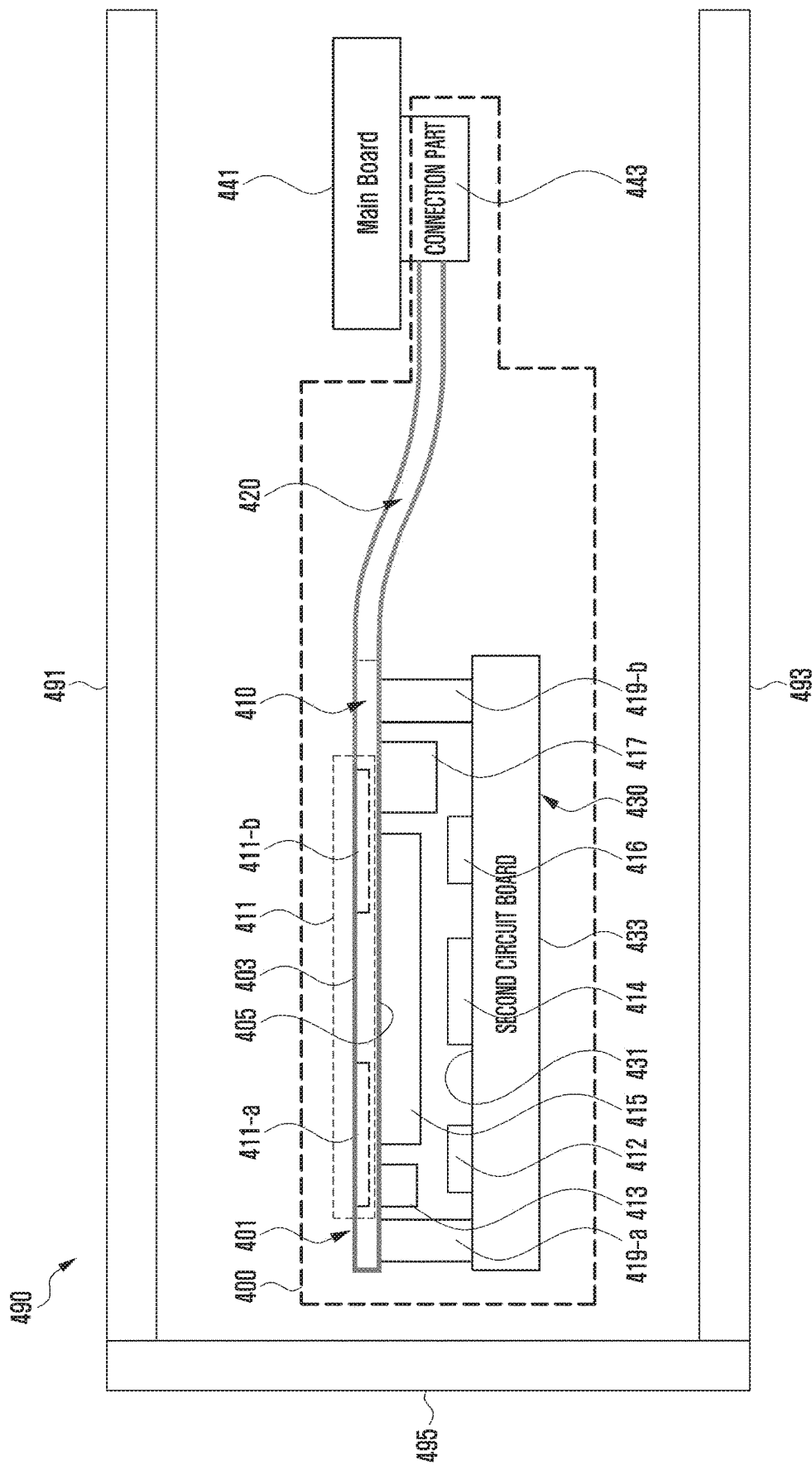
FIG. 4A illustrates an antenna device according to an embodiment of the disclosure.

FIG. 4A illustrates an antenna device according to an embodiment of the disclosure.

Referring to FIG. 4A, an antenna device 400 according to various embodiments of the disclosure may include a first circuit board 401 and a second circuit board 430. The antenna device 400 may be disposed inside the housing 490.

In various embodiments of the disclosure, the housing 490 may include a first plate 493, a second plate 491 facing the opposite direction of the first plate 493, and a side member 495 surrounding the space between the first plate 493 and the second plate 491. The antenna device 400 may be disposed in a region of the space formed by the first plate 493, the second plate 491, and the side member 495.

The first circuit board 401 may be electrically connected to the second circuit board 430 through a first interposer 419-*a* or a second interposer 419-*b* disposed between the first circuit board 401 and the second circuit board 430.

In various embodiments of the disclosure, the first circuit board 401 may include a first surface 403 on which the first antenna pattern 411-*a* or the second antenna pattern 411-*b* is disposed, and a second surface 405 parallel to the first surface 403. The first surface 403 may face a first direction and the second surface 405 may face a second direction opposite to the first direction. At least one of first plural components 413, 415 and 417 of the antenna device may be disposed on the second surface 405. For example, the first plural components 413, 415 and 417 including various components, such as a component for applying a signal to the first antenna pattern 411-*a* or the second antenna pattern 411-*b*, a component for receiving a signal received through the first antenna pattern 411-*a* or the second antenna pattern 411-*b*, and a communication circuit 415 for controlling the emission of signals of the first antenna pattern 411-*a* or the second antenna pattern 411-*b*, may be disposed on the second surface 405. The communication circuit 415 may transmit or receive a signal having a frequency between 3 GHz and 100 GHz.

In various embodiments of the disclosure, the size of the antenna patterns 411-*a* and 411-*b* may differ depending on the wavelength of a signal radiated by the antenna patterns 411-*a* and 411-*b*. For example, if the frequency of the signal radiated by the antenna patterns 411-*a* and 411-*b* is 60 GHz and the wavelength thereof is $1/60$ nm, the length of the antenna patterns 411-*a* and 411-*b* may be $1/120$ nm. The first surface 403 on which the antenna patterns 411-*a* and 411-*b* are disposed may be made of a dielectric. The first antenna pattern 411-*a* and the second antenna pattern 411-*b* may constitute an antenna array 411. Although the antenna patterns 411-*a* and 411-*b* are shown in a rectangular shape in FIG. 4A, the shapes of the antenna patterns 411-*a* and 411-*b* are not limited and various shapes may be used depending on the designer's intention.

In various embodiments of the disclosure, the antenna patterns 411-*a* and 411-*b* may have various shapes, such as a rectangle, a square, and a circle. Antenna patterns having various shapes can be disposed on the first surface 403 in consideration of the radiation efficiency and the position at which the antenna device 400 is to be placed within the electronic device (e.g., the electronic device 101 in FIG. 1).

In various embodiments of the disclosure, at least one of second plural components 412, 414 and 416 of the antenna device 400 may be disposed on the third surface 431 or the fourth surface 433 of the second circuit board 430. For example, the second plural components 412, 414 and 416, such as a component for controlling the power of the first antenna pattern 411-*a* or the second antenna pattern 411-*b*, a component for applying a signal to the first antenna pattern 411-*a* or the second antenna pattern 411-*b*, a component for receiving the signal received through the first antenna pattern 411-*a* or the second antenna pattern 411-*b*, and a communication circuit 415 for controlling the emission of signals of the first antenna pattern 411-*a* or the second antenna pattern 411-*b*, may be disposed on the third surface 431 or on the fourth surface 433.

In various embodiments of the disclosure, the first circuit board 401 may be made of a rigid flexible printed circuit board (RFPCB). The RFPCB may include a rigid area 410 that is hard and non-bendable, and a flexible area 420 that has ductility and can be flexibly bent. At least one of the first plural components 413, 415 and 417 may be mounted on the rigid area 410, and the flexible area 420 may be electrically connected with the rigid area 410. At least one of the antenna patterns 411-*a*, 411-*b* of the antenna device 400 or the first plural components 413, 415 and 417 of the antenna device 400 may be disposed in the rigid area 410. A section of the flexible area 420 may be electrically connected to another board. For example, a section of the flexible area 420 may be electrically connected to the connection part 443 of the main board 441 on which the components of the electronic device (e.g., the electronic device 101 in FIG. 1) are mounted.

According to various embodiments of the disclosure, in the antenna device 400, the first circuit board 401 may be realized using a RFPCB without a separate connection part (e.g., first connection part 237 in FIG. 2, or first connection part 341 in FIG. 3), and thus the space occupied by the connection part can be reduced. In addition, it is possible to reduce the noise of a signal that may be caused by the connection part.

In various embodiments of the disclosure, the first circuit board 401 may be disposed substantially parallel to the first plate 493 and may be disposed between the second printed circuit board 430 and the second plate 491.

Figure 4B:
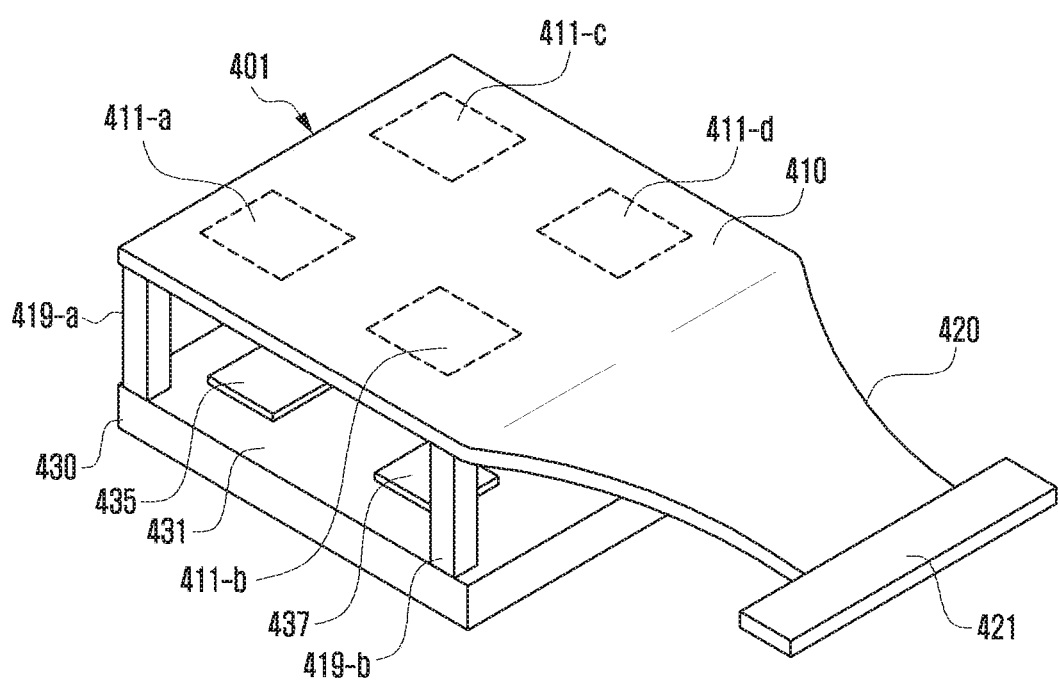
FIG. 4B illustrates an antenna device implemented using a rigid flexible printed circuit board (RFPCB) according to an embodiment of the disclosure.

FIG. 4B illustrates an antenna device implemented using a RFPCB according to an embodiment of the disclosure.

Referring to FIG. 4B, the antenna device 400 may include a first circuit board 401 implemented with a RFPCB, and a second circuit board 430 electrically connected to the first circuit board 401 through a first interposer 419-*a* and a second interposer 419-*b*.

In various embodiments of the disclosure, the first circuit board 401 may include a rigid area 410 and a flexible area 420. The rigid area 410 is a region having hardness and may not be bent well. The flexible area 420 may be flexibly bent.

In various embodiments of the disclosure, the antenna patterns 411-*a*, 411-*b*, 411-*c* and 411-*d* of the antenna device 400 may be disposed in the rigid area 412 of the first circuit board 401. Although not shown in FIG. 4B, various components (e.g., first plural components 413, 415 and 417 in FIG. 4A) of the antenna device 400 may be disposed on the second surface 403 of the first circuit board 401.

In various embodiments of the disclosure, a stiffener having a hard characteristic may be laminated on the back surface of a connector mounted on the surface of a section 421 of the flexible area 420. Due to the laminated stiffener, the section 421 may be hard. The section 421 may be electrically connected to the main board (e.g., main board 441 in FIG. 4A) of the electronic device (e.g., the electronic device 101 in FIG. 1). As the section 421 of the flexible area 420 is electrically connected to the connection part 443 of the main board 441, electrical signals can be transmitted and received between the antenna device 400 and various components arranged on the main board 441.

In various embodiments of the disclosure, at least one of the second plural components 435 and 437 of the antenna device 400 may be disposed on the third surface 431 of the second circuit board 430 of the antenna device 400. For example, the second plural components (e.g., second plural components 413, 415 and 417 in FIG. 4A) that may be included in the antenna device 400, such as a circuit for controlling the power supply of the antenna device 400, a component for receiving the signal received through the antenna patterns 411-*a*, 411-*b*, 411-*c* and 411-*d*, and a communication circuit (e.g., communication module 190 in FIG. 1) for controlling the emission of signals of the antenna patterns 411-*a*, 411-*b*, 411-*c* and 411-*d*, may be disposed on the third surface 431 of the second circuit board 430.

Figure 4C:
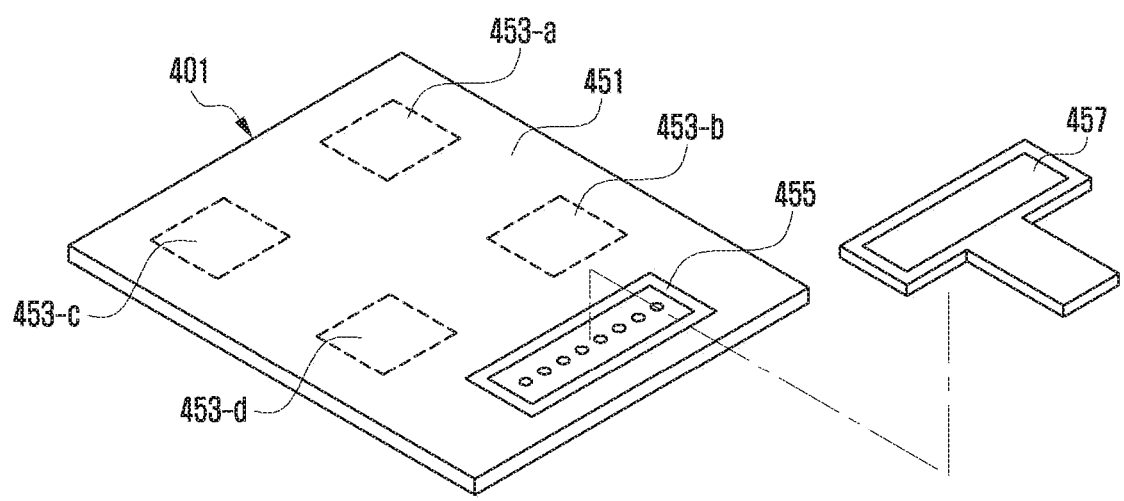
FIG. 4C illustrates an antenna device implemented using a hot bar according to an embodiment of the disclosure.

FIG. 4C illustrates an antenna device implemented using a hot bar according to an embodiment of the disclosure.

Referring to FIG. 4C, the antenna patterns 453-*a*, 453-*b*, 453-*c* and 453-*d* may be disposed on the first circuit board 401. The antenna patterns 453-*a*, 453-*b*, 453-*c* and 453-*d* may radiate signals under the control of the communication circuit (e.g., communication module 190 in FIG. 1). The first circuit board 401 may have a connection terminal 455, which can be connected to a signal transmission line 457 connectable to the main board (e.g., main board 441 in FIG. 4A). The signal transmission line 457 can be in contact with the connection terminal 455, and the electrical connection between the first circuit board 401 and the main board 441 can be made via the signal transmission line 457.

In various embodiments of the disclosure, the first circuit board 401 of the antenna device 400 may be electrically connected to the signal line 457 connectable to the main board by using a soldering process. The soldering process can bond metals together using heat or the like. For example, the connection terminals 455 on the first circuit board 401 of the antenna device 400 and the terminals of the signal transmission line 457 may be electrically connected in the form of a hot bar by a soldering process.

The embodiment shown in FIGS. 4A to 4C may include an embodiment where the first circuit board 401 on which the antenna patterns 411-*a*, 411-*b*, 411-*c* and 411-*d* are disposed is implemented by using a RFPCB or a hot bar. In various embodiments of the disclosure, the second circuit board 430 may be implemented by using a RFPCB or a hot bar.

FIG. 4D illustrates a layered structure of circuit boards in an electronic device according to an embodiment of the disclosure.

Referring to FIG. 4D, the first circuit board 401 (e.g., first circuit board 401 in FIG. 4A) may include plural first insulating layers 471*a* or plural first wiring layers 471*b* disposed between the adjacent first insulating layers 471*a* stacked between one surface (e.g., first surface 403 in FIG. 4A) and the other surface (e.g., second surface 405 in FIG. 4A). In an embodiment of the disclosure, at least some of the first wiring layers 471*b* include a conductive patch (e.g., antenna patch 411 in FIG. 4A), so that some of the antenna patterns (e.g., antenna patterns 411-a, 411-b, 411-c and 411-d in FIG. 4A) may be formed in the first circuit board 401. In various embodiments of the disclosure, the rigid area 410 (e.g., rigid area 410 in FIG. 4A) may include at least one first ground plane 471g being one of the first wiring layers 471b.

In an embodiment of the disclosure, the conductive patch may be utilized as an antenna pattern of a communication device (e.g., communication module 190 in FIG. 1), and may be disposed on an edge of the first insulating layers 471a. Here, the "edge" may indicate the top surface (or bottom surface) of the stacked first insulating layers 471a. In another embodiment of the disclosure, the 'edge' may refer to a region adjacent to the side of the rigid area 410 of the first circuit board 401 from each of the stacked first insulating layers 471a.

In various embodiments of the disclosure, at least a portion of the conductive material constituting the wiring layer may be removed (fill-cut) in the other wiring layer at which the conductive patch is not disposed. In partially removing the conductive material constituting the wiring layer, the antenna performance, for example, the radiation performance of the communication module 190 shown in FIG. 1 and the rigidity of the first circuit board 401 can be considered. For example, when a plurality of conductive patches disposed in the rigid area 410 of the first circuit board 401 are used as a radiating conductor, to partially remove the conductive material of the wiring layer, the radiation performance of the communication module, the rigidity of the first circuit board 401, or the isolation between the conductive patches can be considered.

In various embodiments of the disclosure, the first ground plane 471g may be a conductive plate substantially corresponding to the entire area of the rigid area 410. The first ground plane 471g may include, for example, through holes or openings. For example, with respect to the first ground plane 471g, the first wiring layer(s) 471b on one side of the rigid area 410 and the first wiring layer(s) on the other side of the rigid area 410 may be electrically connected via through holes formed in the first ground plane 471g. The first ground plane 471g provided as one of the first wiring layers 471b may block electromagnetic interference between the antenna patterns (e.g., antenna pattern 411-a and 411-b in FIG. 4A) and the communication circuit 190, and may provide the reference potential to thereby stabilize the radio wave transmission and reception environment of the antenna patterns 411-a and 411-b.

In various embodiments of the disclosure, the flexible area 420 (e.g., flexible area 420 in FIG. 4A) of the first circuit board 401 may be a flexible printed circuit board, and may be realized using a multi-layered circuit board in which a plurality of second insulating layers 473a and a plurality of second wiring layers 473b are alternately stacked. In an embodiment of the disclosure, the number of the second insulating layers 473a may be the same as or different from the number of the first insulating layers 471a. The flexible area 420 may include at least one electrically conductive path connecting the first circuit board (e.g., first circuit board 401 in FIG. 4A) and the main board (e.g., main board 441 in FIG. 4A) together. For example, the conductive path may be formed along the second insulating layers 473a to transmit power or control signals provided from the power management module or the processor. In an embodiment of the disclosure, the flexible area 420 may include a conductive path for transmitting a communication signal provided by a wireless transceiver or for transmitting a communication signal received through the communication module 190 to the wireless transceiver. In an embodiment of the disclosure, the conductive path(s) of the flexible area 420 may be formed on at least some of the second wiring layers 473b.

In an embodiment of the disclosure, some of the conductive paths of the flexible area 420 may be electrically connected to the first ground plane 471g. For example, the conductive paths of the flexible area 420 may include transmission paths for the delivery of power or control signals, and ground conductors arranged between these signal transmission paths. For example, some of the conductive paths of the flexible area 420 may be provided as ground conductors connected to the first ground plane 471g, suppressing electromagnetic interference between the signal transmission paths.

In various embodiments of the disclosure, at least one of the second insulating layers 473a may be connected to at least one of the first insulating layers 471a. In an embodiment of the disclosure, the second insulating layers 473a may be extended from one of the first insulating layers 471a. For example, some of the first insulating layers 471a may be further extended from the side of the flexible area 420 to form at least some of the second insulating layers 473a. In an embodiment of the disclosure, at least one of the second wiring layers 473b may be connected to at least one of the first wiring layers 471b. At least one of the second wiring layers 473b may be extended from one of the first wiring layers 471b. For example, some of the first wiring layers 471b may be further extended to form the second wiring layers 473b.

In various embodiments of the disclosure, at least one of the second wiring layers 473b may be provided as a second ground plane 473g. In an embodiment of the disclosure, the second ground plane 473g may be disposed between some of the second wiring layers 473b carrying communication signals and some other of the second wiring layers 473b carrying power (or control signals). For example, the second ground plane 473g can improve stability of communication signal transmission or stability of power (or control signal) transmission. In an embodiment of the disclosure, the second ground plane 473g may be at least partially coplanar with the first ground plane 471g. In an embodiment of the disclosure, to ensure stability of communication signal transmission, the flexible area 420 may further include additional ground conductors or via conductors. The shape and arrangement of additional ground conductors or via conductors can be differently designed in consideration of the flexible area 420 to be actually fabricated and its conductive paths.

In various embodiments of the disclosure, the second insulating layers 473a may be extended from some of the first insulating layers 471a, and the second wiring layers 473b may be extended from some of the first wiring layers 471b. In an embodiment of the disclosure, at least some of the second wiring layers 473b may provide conductive paths for transmitting power, control signals, or communication signals. One of the second wiring layers 473b may form a ground plane (e.g., second ground plane 413g) between a conductive path for transmitting a communication signal and a conductive path for transmitting power or a control signal. In an embodiment of the disclosure, the conductive path carrying a communication signal may be disposed between the wiring layers provided as a ground plane. In an embodiment of the disclosure, the conductive path carrying power or a control signal may be disposed between the other wiring layers provided as a ground plane. For example, the flexible area 420 provided with a plurality of wiring layers as a ground plane may provide a shielding environment for conductive paths for transmitting a communication signal or for conductive paths for transmitting power or a control signal. In an embodiment of the disclosure, the conductive path may be formed only in one wiring layer among the first wiring layers 471b or the second wiring layers 473b, and may be formed via another adjacent wiring layer through via holes or the like formed in the first insulating layers 471a or the second insulating layers 473a if necessary.

FIG. 4E illustrates an antenna device according to an embodiment of the disclosure.

Referring to FIG. 4E, the antenna device 400 according to various embodiments of the disclosure may include a first circuit board 401 and a second circuit board 430. The antenna device 400 may be disposed inside the housing 490.

In various embodiments of the disclosure, the housing 490 may include a first plate 493, a second plate 491 facing the opposite direction of the first plate 493, and a side member 495 surrounding the space between the first plate 493 and the second plate 491. The antenna device 400 may be disposed in a region of the space formed by the first plate 493, the second plate 491, and the side member 495.

The first circuit board 401 may be electrically connected to the second circuit board 430 by using the first interposer 419-a or the second interposer 419-b disposed between the first circuit board 401 and the second circuit board 430.

In various embodiments of the disclosure, the first circuit board 401 may include a first surface 403 on which the first antenna pattern 411-a or the second antenna pattern 411-b is disposed, and a second surface 405 facing away from the first surface 403. The first surface 403 may face a first direction and the second surface 405 may face a second direction opposite to the first direction. At least one of first plural components (e.g., first plural components 413, 415 and 417 in FIG. 4A) of the antenna device may be disposed on the second surface 405. For example, at least one of the first plural components 413, 415 and 417, such as a component for applying a signal to the first antenna pattern 411-a or the second antenna pattern 411-b, a component for receiving a signal received through the first antenna pattern 411-a or the second antenna pattern 411-b, and a communication circuit 415 for controlling the emission of signals of the first antenna pattern 411-a or the second antenna pattern 411-b, may be disposed on the second surface 405. The communication circuit 415 may transmit or receive a signal having a frequency between 3 GHz and 100 GHz.

In various embodiments of the disclosure, at least one of second plural components 412, 414 and 416 of the antenna device 400 may be disposed on the fourth surface 433 or the third surface 431 of the second circuit board 430. For example, the second plural components 412, 414 and 416, such as a component for controlling the power of the first antenna pattern 411-a or the second antenna pattern 411-b, a component for applying a signal to the first antenna pattern 411-a or the second antenna pattern 411-b, a component for receiving the signal received through the first antenna pattern 411-a or the second antenna pattern 411-b, and a communication circuit for controlling the emission of signals of the first antenna pattern 411-a or the second antenna pattern 411-b, may be disposed on the third surface 431 or on the fourth surface 433.

In various embodiments of the disclosure, the first circuit board 401 may face a portion of the side member 495 and may be disposed between the second circuit board 430 and a portion of the side member 495. While the first circuit board 401 of the antenna device 400 shown in FIG. 4A is disposed substantially parallel to the first plate 493, the first circuit board 401 of the antenna device 400 shown in FIG. 4E may be disposed substantially perpendicular to the first plate 493. In particular, the first circuit board 401 may be implemented using a RFPCB, and the antenna device 400 can be disposed on various positions inside the housing 490 due to the high bendability of the flexible area 420 in the RFPCB.

Figure 5A:
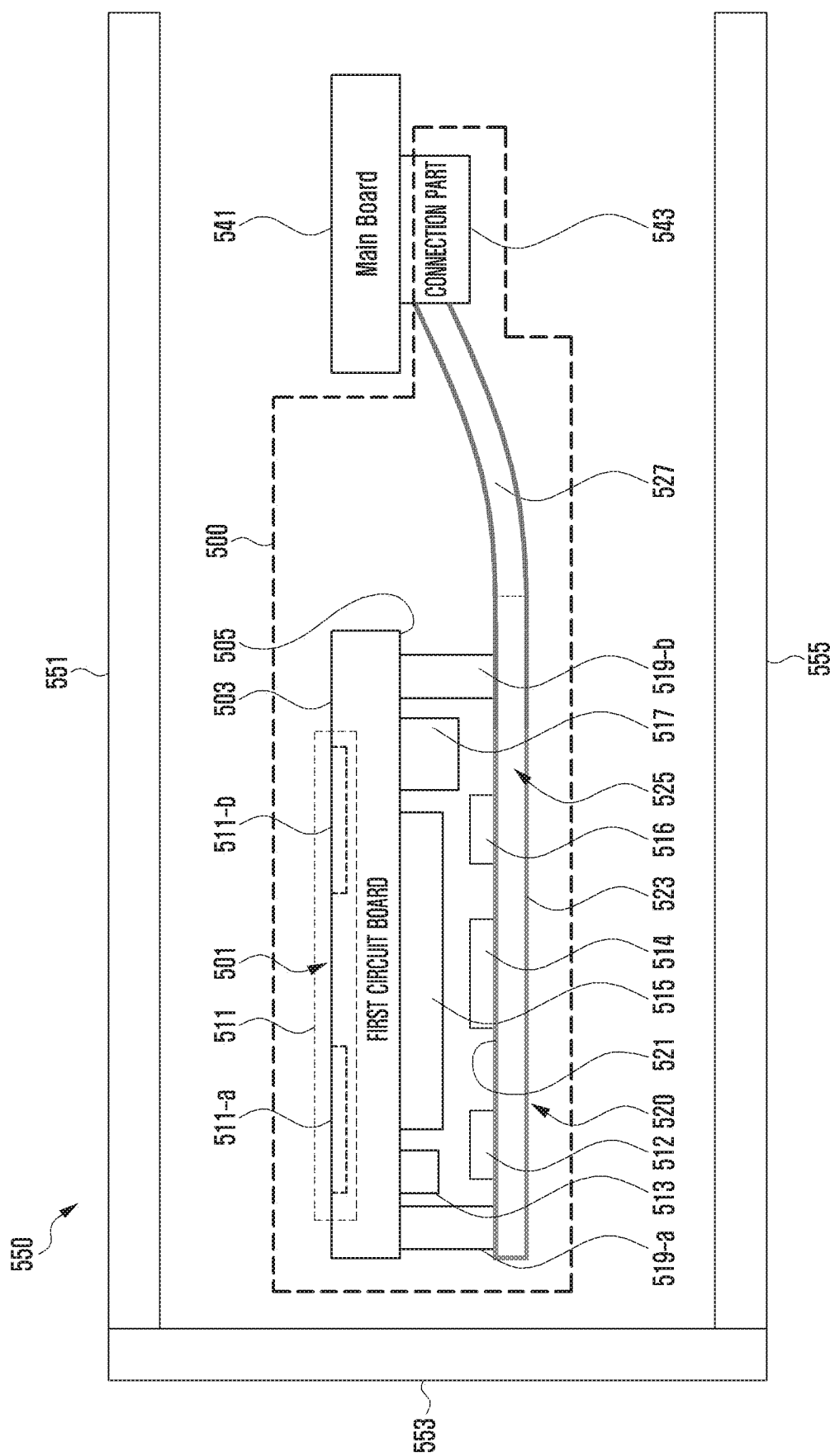
FIG. 5A illustrates an antenna device according to an embodiment of the disclosure.

FIG. 5A illustrates an antenna device according to an embodiment of the disclosure.

Referring to FIG. 5A, the antenna device 500 according to various embodiments of the disclosure may include a first circuit board 501 and a second circuit board 520 electrically connected to the first circuit board 501. The antenna device 500 may be placed inside the housing 550.

In various embodiments of the disclosure, the housing 550 (e.g., housing 490 in FIG. 4A) may include a first plate 555 (e.g., first plate 493 in FIG. 4A), a second plate 551 (e.g., second plate 491 in FIG. 4A) facing the opposite direction of the first plate 555, and a side member 553 (e.g., side member 495 in FIG. 4A) surrounding the space between the first plate 555 and the second plate 551.

In various embodiments of the disclosure, the antenna patterns 511-a and 511-b may be disposed on the first surface 503 of the first circuit board 501. At least one of first plural components 513, 515 and 517 included in the antenna device 500 may be disposed on the second surface 505 facing away from the first surface 503. For example, the first plural components 513, 515 and 517, such as a component for controlling the power of the antenna patterns 511-a and 511-b, a component for applying a signal to the antenna patterns 511-a and 511-b, a component for receiving the signal received through the antenna patterns 511-a and 511-b, and a communication circuit 515 for controlling the radiation of signals of the antenna patterns 511-a and 511-b, may be disposed on the second surface 505. The first antenna pattern 511-a and the second antenna pattern 511-b may constitute an antenna array 511. The communication circuit 515 may transmit or receive a signal having a frequency between 3 GHz and 100 GHz.

In various embodiments of the disclosure, the first circuit board 501 may be electrically connected to the second circuit board 520 through a first interposer 519-a or a second interposer 519-b disposed between the first circuit board 501 and the second circuit board 520.

In various embodiments of the disclosure, the second circuit board 520 may be implemented using a RFPCB. The RFPCB may be a circuit board including a rigid area 525 with hardness and being not bendable, and a flexible area 527 with ductility and being flexibly bendable. At least one of plural components (not shown) may be mounted on the rigid area 525, and the flexible area 527 may be electrically connected to the rigid area 525. In FIG. 5A, at least one of the second plural components 512, 514 and 516 of the antenna device 500 may be disposed on the third surface 521 or the fourth surface 523 of the second circuit board 520 in the rigid area 525 of the second circuit board 520. One end of the flexible area 527 of the second circuit board 520 may be connected to the connection part 543 of the main board 541. The flexible area 527 may serve as a signal transmission line between the antenna device 500 and the main board 541.

In various embodiments of the disclosure, the first circuit board 501 disposed substantially parallel to the first plate 555 may be placed between the second circuit board 520 and the second plate 551.

FIG. 5B illustrates an antenna device according to an embodiment of the disclosure.

Referring to FIG. 5B, the antenna device 500 according to various embodiments of the disclosure may include a first circuit board 501 and a second circuit board 520 electrically connected to the first circuit board 501. The antenna device 500 may be disposed inside the housing 550.

In various embodiments of the disclosure, the housing 550 (e.g., housing 490 in FIG. 4A) may include a first plate 555 (e.g., first plate 493 in FIG. 4A), a second plate 551 (e.g., second plate 491 in FIG. 4A) facing the opposite direction of the first plate 551, and a side member 553 (e.g., side member 495 in FIG. 4A) surrounding the space between the first plate 555 and the second plate 551.

In various embodiments of the disclosure, the antenna patterns 511-a and 511-b may be disposed on the first surface 503 of the first circuit board 501. At least one of first plural components 513, 515 and 517 included in the antenna device 500 may be disposed on the second surface 505 facing away from the first surface 503. For example, the first plural components 513, 515 and 517, such as a component for controlling the power of the antenna patterns 511-a and 511-b, a component for applying a signal to the antenna patterns 511-a and 511-b, a component for receiving the signal received through the antenna patterns 511-a and 511-b, and a communication circuit 515 for controlling the emission of signals of the antenna patterns 511-a and 511-b, may be disposed on the second surface 505. The first antenna pattern 511-a and the second antenna pattern 511-b may constitute an antenna array 511. The communication circuit 515 may transmit or receive a signal having a frequency between 3 GHz and 100 GHz.

In various embodiments of the disclosure, the first circuit board 501 may be electrically connected to the second circuit board 520 through a first interposer 519-a or a second interposer 519-b disposed between the first circuit board 501 and the second circuit board 520. At least one of the second plural components 512, 514 and 516 of the antenna device 500 may be disposed in the rigid area 525 of the second circuit board 520.

In various embodiments of the disclosure, the second circuit board 520 may be implemented using a RFPCB. The RFPCB may be a circuit board that includes a rigid area 525 being hard and non-bendable and a flexible area 527 being ductile and flexibly bent. At least one of the second plural components 512, 514 and 516 may be mounted in the rigid area 525, and the flexible area 527 may be electrically connected to the rigid area 525. In FIG. 5B, the second plural components 512, 514 and 516 of the antenna device 500 may be disposed in the rigid area 525 of the second circuit board 520. One end of the flexible area 527 of the second circuit board 520 may be connected to the connection part 543 of the main board 541. The flexible area 527 may serve as a signal transmission line between the antenna device 500 and the main board 541.

In various embodiments of the disclosure, the first circuit board 501 may face a portion of the side member 553 and may be disposed between the second circuit board 520 and a portion of the side member 553. While the first circuit board 501 of the antenna device 500 shown in FIG. 5A is disposed substantially parallel to the first plate 555, the first circuit board 501 of the antenna device 500 shown in FIG. 5B may be disposed substantially perpendicular to the first plate 555. In particular, the second circuit board 520 may be implemented using a RFPCB, due to the flexible nature of the flexible area 527 of the RFPCB, the antenna device 500 can be placed in various directions (e.g., in a direction toward the second plate 551, or in a direction toward the side member 553).

In the embodiments shown in FIGS. 4A, 4B, 4C, 4D, 4E, 5A and 5B, one of the first circuit board (e.g., first circuit board 401 in FIG. 4A, or first circuit board 501 in FIG. 5A) and the second circuit board (e.g., second circuit board 430 in FIG. 4A, or second circuit board 520 in FIG. 5A) is implemented using a RFPCB, so that the antenna device (e.g., antenna device 400 in FIG. 4A, or antenna device 500 in FIG. 5A) does not need to have a separate connection terminal. Consequently, the space occupied by the connection terminals can be saved, and a separate bonding process between the antenna devices 400 or 500 and the main board 441 or 451 can be omitted, thereby simplifying the manufacturing process.

Figure 6B:
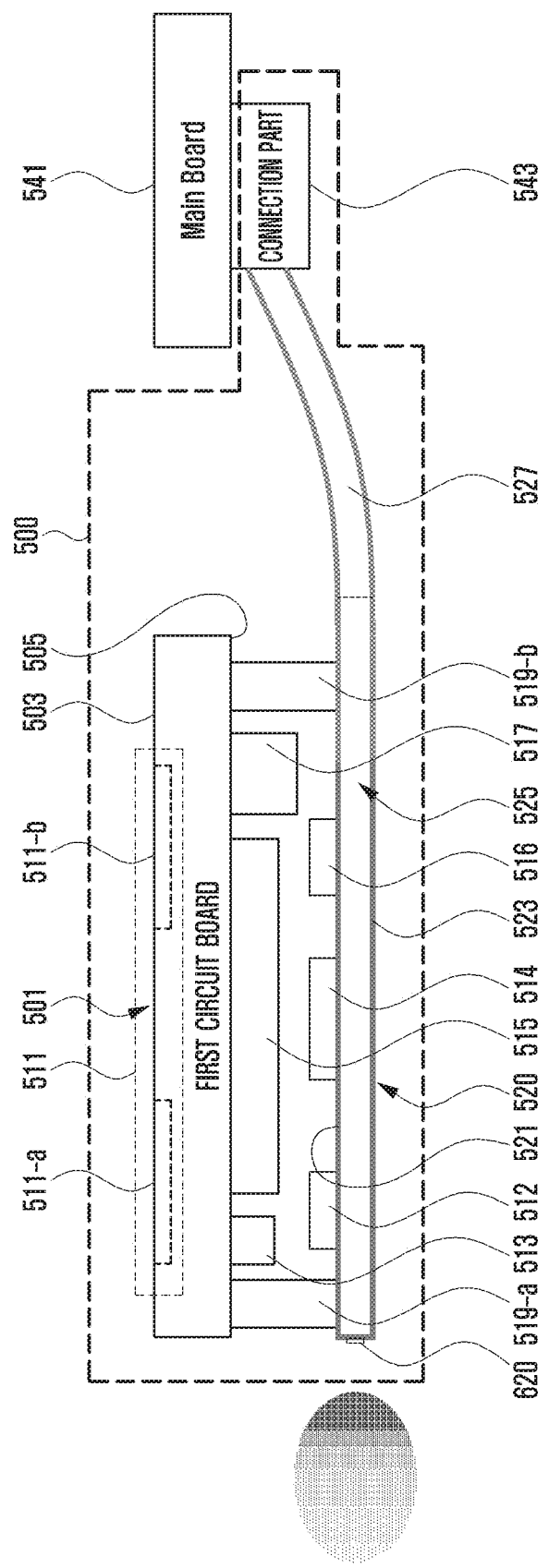
FIG. 6B illustrates an antenna pattern being disposed on a side of one of a first circuit board and a second circuit board in an antenna device according to an embodiment of the disclosure.

FIGS. 6A and 6B illustrate an antenna pattern being disposed on a side of one of a first circuit board and a second circuit board in an antenna device according to various embodiments of the disclosure.

In various embodiments of the disclosure, the antenna device 400 may include at least one antenna pattern disposed on a side (or, a plane perpendicular to each of the first and second surfaces, or a plane perpendicular to each of the third and fourth surfaces) of one of the first circuit board 401 or the second circuit board 430.

Referring to FIG. 6A, the antenna device 400 may include a first circuit board 401 having a second surface 405 and a first surface 403 parallel to the second surface 405 and on which the antenna patterns 411-a and 411-b are disposed, and a second circuit board 430 placed in parallel with the first circuit board 401. At least one of first plural components 413, 415 and 417 may be disposed on the second surface 405.

In various embodiments of the disclosure, the antenna device 400 may further include a third antenna pattern 610 disposed on the side of the second circuit board 430. The direction of the signal radiated by the third antenna pattern 610 may make a preset angle (e.g., 90 degrees) with respect to the direction of the signal radiated by the first antenna pattern 511-a or the second antenna pattern 511-b.

Although the third antenna pattern 610 is shown enlarged for ease of explanation in FIG. 6A, the third antenna pattern 610 may be implemented as being disposed on the side of the second circuit board 430.

In various embodiments of the disclosure, the first circuit board 401 may be implemented using a RFPCB or a hot bar. When the first circuit board 401 is implemented using a RFPCB, the first plural components 413, 415 and 417 of the antenna device 400 and the antenna patterns 411-a and 411-b may be disposed in the rigid area 410, and the flexible area 420 may be electrically connected to the connection part 443 of the main board 441.

In various embodiments of the disclosure, the antenna device 400 including the third antenna pattern 610 can radiate signals in various directions, and the efficiency of side radiation can be improved due to the third antenna pattern 610.

Referring to FIG. 6B, the antenna device 500 may include a first circuit board 501a that has a second surface 505 on which various components of the antenna device 500 are disposed and a first surface 503 facing away from the second surface 505 and on which the antenna patterns 511-a and 511-b are disposed, and a second circuit board 520 parallel to the first circuit board 501.

In various embodiments of the disclosure, the third antenna pattern 620 may be disposed on the side of the second circuit board 520. The direction of the signal radiated by the third antenna pattern 620 can make a preset angle (e.g., 90 degrees) with respect to the direction of the signal radiated by the first antenna pattern 511-*a* or the second antenna pattern 511-*b*.

In various embodiments of the disclosure, the second circuit board 520 may be implemented using a RFPCB or a hot bar. When the second circuit board 520 is implemented using a RFPCB, at least one of the second plural components 512, 514 and 516 of the antenna device 500 may be disposed in the rigid area 525, and the flexible area 527 may be electrically connected to the connection part 543 of the main board 541.

In various embodiments of the disclosure, the antenna device 500 including the third antenna pattern 620 can radiate signals in various directions and improve the efficiency of the side radiation due to the third antenna pattern 620.

Figure 7A:
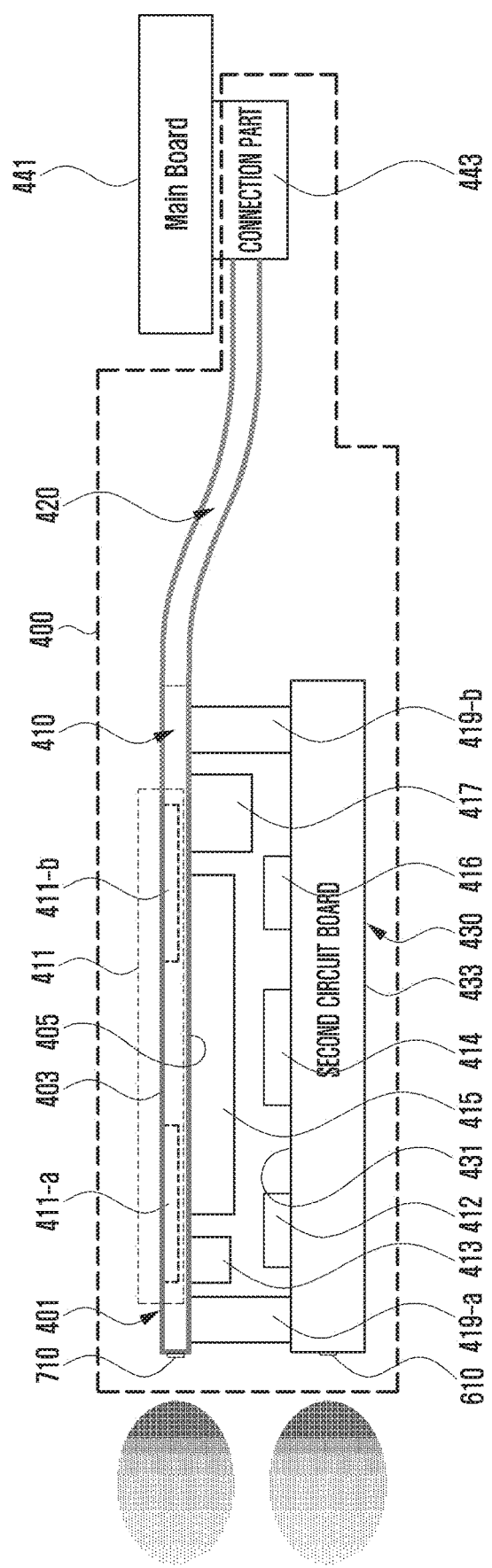
FIG. 7A illustrates an antenna being disposed on sides of both of a first circuit board and a second circuit board in an antenna device according to an embodiment of the disclosure.
Figure 7B:
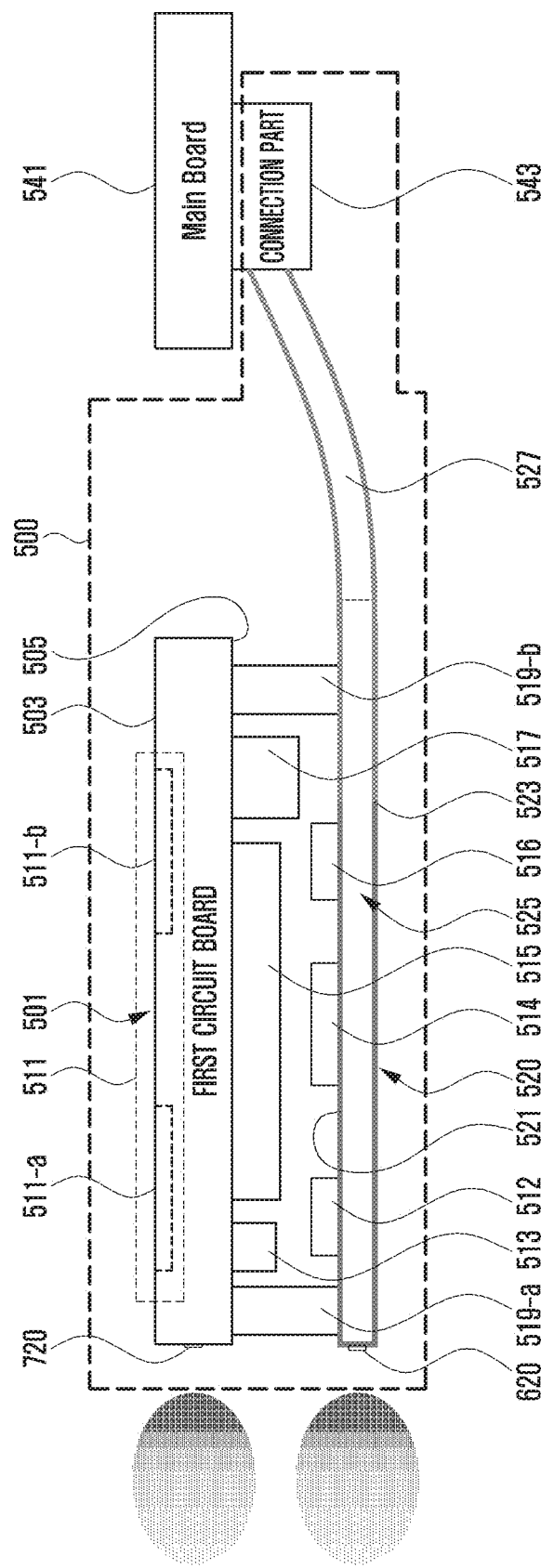
FIG. 7B illustrates an antenna being disposed on sides of both of a first circuit board and a second circuit board in an antenna device according to an embodiment of the disclosure.

FIGS. 7A and 7B illustrate antennas being disposed on sides of a first circuit board and a second circuit board in an antenna device according to various embodiments of the disclosure.

In various embodiments of the disclosure, the antenna device 400 may include antenna patterns 610 and 710 disposed on the sides (e.g., the side perpendicular to the second surface 405 on which at least one of the first plural components 413, 415 and 417 of the antenna device 400 may be disposed and perpendicular to the first surface 403 on which the antenna patterns 411-*a* and 411-*b* can be arranged, or the side perpendicular to the third surface 431 facing the first surface 403 and perpendicular to the fourth surface 433 facing the third surface 431 and the second surface 405) of the first circuit board 401 and the second circuit board 430.

Referring to FIG. 7A, the antenna device 400 may include a first circuit board 401 that has a second surface 405 on which at least one of the first plural components 413, 415 and 417 of the antenna device 400 is disposed and a first surface 403 facing away from the second surface 405 and on which the antenna patterns 411-*a* and 411-*b* are disposed, and a second circuit board 430 placed in parallel with the first circuit board 401 and on which at least one of the second plural components 412, 414 and 416 of the antenna device 400 is disposed.

In various embodiments of the disclosure, the first circuit board 401 may be implemented using as a RFPCB or a hot bar. When the first circuit board 401 is implemented using a RFPCB, various components of the antenna device 400 and the first antenna pattern 411-*a* or the second antenna pattern 411-*b* may be disposed in the rigid area 410, and the flexible area 420 may be electrically connected to the connection part 443 of the main board 441.

In various embodiments of the disclosure, the third antenna pattern 610 may be disposed on the side of the second circuit board 430. The direction of the signal radiated by the third antenna pattern 610 may make a preset angle (e.g., 90 degrees) with respect to the direction of the signal radiated by the first antenna pattern 411-*a* or the second antenna pattern 411-*b*.

In various embodiments of the disclosure, the fourth antenna pattern 710 may be disposed on the side of the first circuit board 401. The direction of the signal radiated by the fourth antenna pattern 710 may make a preset angle (e.g., 90 degrees) with respect to the direction of the signal radiated by the first antenna pattern 411-*a* or the second antenna pattern 411-*b*. The direction of the signal radiated by the fourth antenna pattern 710 may make a preset angle (e.g., 0 degrees) with respect to the direction of the signal radiated by the second antenna pattern 710.

In various embodiments of the disclosure, the antenna device 400 including the third antenna pattern 610 and the fourth antenna pattern 710 can increase the radiation efficiency of signals in the side direction. For example, compared to the embodiment of FIG. 6A in which the third antenna pattern 610 is arranged, the antenna device 400 can improve the efficiency of side radiation due to the fourth antenna pattern 710.

In various embodiments of the disclosure, the third antenna pattern 610 and the fourth antenna pattern 710 may be formed respectively on the sides of the first circuit board 401 and the second circuit board 430 through a printing process. Although the sizes of the third antenna pattern 610 and the fourth antenna pattern 710 are exaggerated in FIG. 7A for the ease of explanation, the third antenna pattern 610 and the fourth antenna pattern 710 may be disposed respectively on the sides of the first circuit board 401 and the second circuit board 430.

In various embodiments of the disclosure, the fourth antenna pattern 710 can be mounted in various shapes on the side of the antenna device 400. The fourth antenna pattern 710 may have a dipole antenna structure. The fourth antenna pattern 710 may be implemented by plating a section of the side of the first circuit board 401 to generate an array. In addition, the fourth antenna pattern 710 may be formed on at least one of the multiple layers constituting the first circuit board 401.

Referring to FIG. 7B, the antenna device 500 may include a first circuit board 501 that has a second surface 505 on which at least one of the first plural components 513, 515 and 517 of the antenna device 500 is disposed and a first surface 503 parallel with the second surface 405 and on which the antenna patterns 511-*a* and 511-*b* are disposed, and a second circuit board 520 placed in parallel with the first circuit board 501 and on which at least one of the second plural components 512, 514 and 516 of the antenna device 500 is disposed.

In various embodiments of the disclosure, the second circuit board 520 may be implemented using a RFPCB or a hot bar. When the second circuit board 520 is implemented using a RFPCB, various components of the antenna device 500 may be disposed in the rigid area 525, and the flexible area 527 may be electrically connected to the connection part 543 of the main board 541.

In various embodiments of the disclosure, the third antenna pattern 620 may be formed on the side of the second circuit board 520 electrically connected to the first circuit board 501 on which the first antenna pattern 511-*a* or the second antenna pattern 511-*b* is disposed. The direction of the signal radiated by the third antenna pattern 620 may make a preset angle (e.g., 90 degrees) with respect to the direction of the signal radiated by the first antenna pattern 511-*a* or the second antenna pattern 511-*b*.

In various embodiments of the disclosure, the antenna device 500 including the third antenna pattern 620 can radiate signals in various directions and improve the efficiency of side radiation due to the third antenna pattern 620.

In various embodiments of the disclosure, the fourth antenna pattern 720 may be disposed on the side of the first circuit board 501 on which the first antenna pattern 511-*a* or the second antenna pattern 511-*b* is disposed. The direction of the signal radiated by the fourth antenna pattern 720 may make a preset angle (e.g., 90 degrees) with respect to the direction of the signal radiated by the first antenna pattern 511-*a* or the second antenna pattern 511-*b*. The direction of the signal radiated by the fourth antenna pattern 720 may make a preset angle (e.g., 0 degree) with respect to the direction of the signal radiated by the third antenna pattern 620.

In various embodiments of the disclosure, the antenna device 500 including the third antenna pattern 620 and the fourth antenna pattern 720 may emit signals in various directions. The antenna device 400 can improve the efficiency of side radiation due to the fourth antenna pattern 720 compared to the embodiment of FIG. 6B in which the third antenna pattern 620 is disposed.

Figure 8:
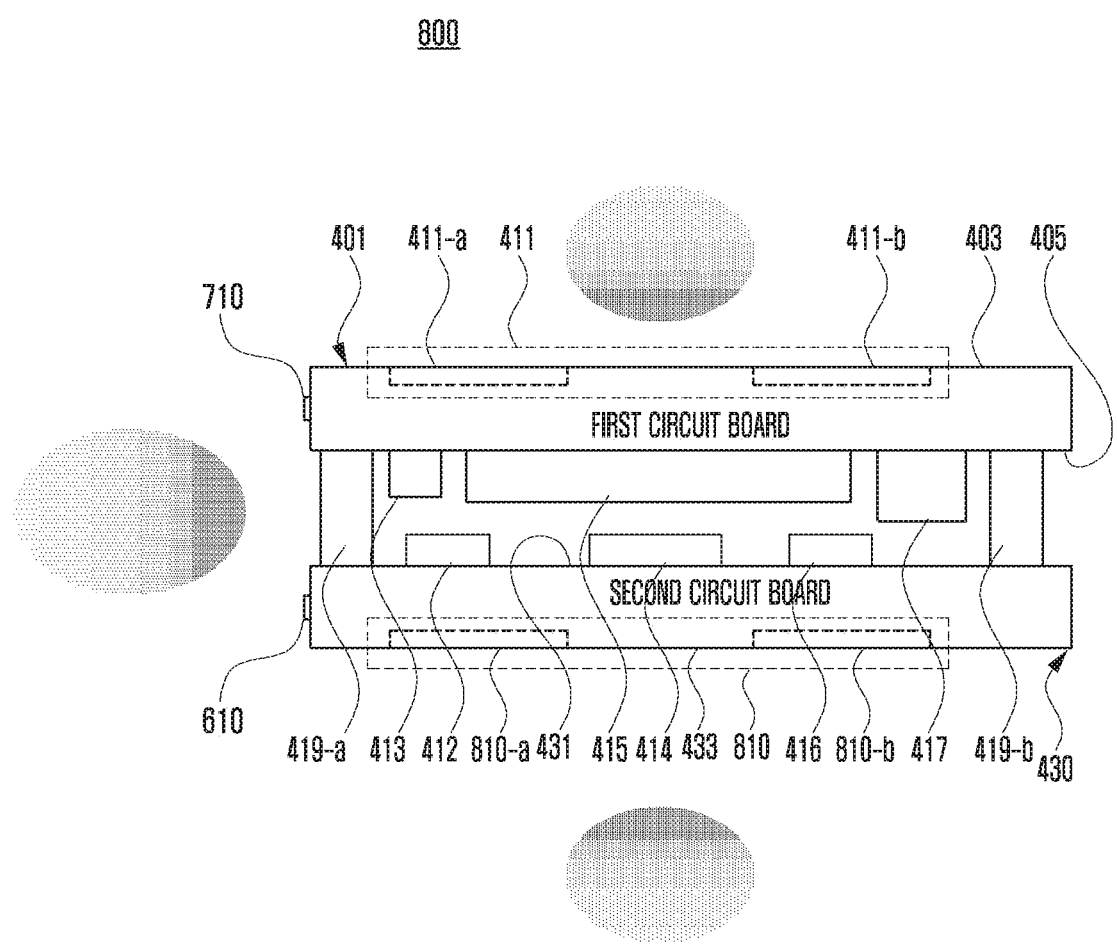
FIG. 8 illustrates an antenna being disposed on a back surface of a second circuit board in an antenna device according to an embodiment of the disclosure.

FIG. 8 illustrates an antenna being disposed on a back surface of a second circuit board in an antenna device according to an embodiment of the disclosure.

Referring to FIG. 8, in various embodiments of the disclosure, the second circuit board 430 (e.g., second circuit board 430 in FIG. 6A) may include a third surface 431 facing the first circuit board 401 (e.g., first circuit board 401 in FIG. 6A), and a fourth surface 433 parallel to the third surface 431. At least one of the first plural components 413, 415 and 417 of an antenna device 800 (e.g., antenna device 400 in FIG. 6A) may be disposed on the second surface 405, and at least one of the second plural components 412, 414 and 416 may be disposed on the third surface 431. The first antenna pattern 411-*a* or the second pattern 411-*b* of the antenna device 800 may be disposed on the first surface 403 of the first circuit board 401.

In various embodiments of the disclosure, the antenna device 400 may include a fifth antenna pattern 810-*a* or a sixth antenna pattern 810-*b* disposed on the fourth surface 433 of the second circuit board 430. The direction of the signal emitted by the fifth antenna pattern 810-*a* or the sixth antenna pattern 810-*b* may make a specific angle (e.g., 180 degrees) with respect to the direction of the signal emitted by the first antenna pattern 411-*a* or the second pattern 411-*b*. The fifth antenna pattern 810-*a* and the sixth antenna pattern 810-*b* may constitute an antenna array 810.

In various embodiments of the disclosure, the fifth antenna pattern 810-*a* or the sixth antenna pattern 810-*b* may be formed in the same shape as the first antenna pattern 411-*a* or the second pattern 411-*b*.

In various embodiments of the disclosure, the size of the fifth antenna pattern 810-*a* or the sixth antenna pattern 810-*b* may vary according to the wavelength of the signal radiated by the fifth antenna pattern 810-*a* or the sixth antenna pattern 810-*b*. For example, the length of the fifth antenna pattern 810-*a* and the sixth antenna pattern 810-*b* may be $1/120$ nm when the frequency of the emitted signal is 60 GHz and the wavelength is $1/60$ nm. The fourth surface 433 on which the fifth antenna pattern 810-*a* or the sixth antenna pattern 810-*b* is disposed may be implemented using a dielectric.

In various embodiments of the disclosure, the antenna device 800 including the fifth antenna pattern 810-*a* or the sixth antenna pattern 810-*b* may emit signals in various directions.

Figure 9:
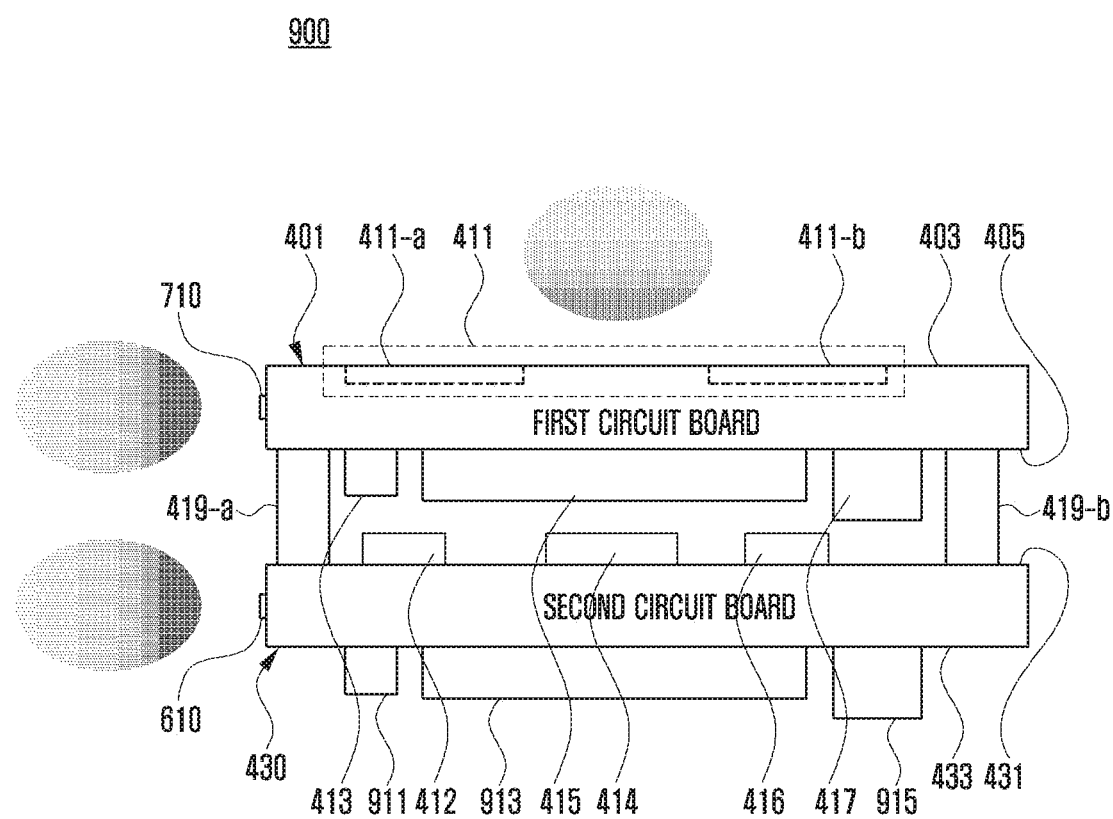
FIG. 9 illustrates components of an antenna device being disposed on a back surface of a second circuit board in an antenna device according to an embodiment of the disclosure.

FIG. 9 illustrates components of an antenna device being disposed on a back surface of a second circuit board in the antenna device according to an embodiment of the disclosure.

Referring to FIG. 9, in various embodiments of the disclosure, the second circuit board 430 (e.g., second circuit board 430 in FIG. 6A) may include a third surface 431 facing the first circuit board 401 (e.g., first circuit board 401 in FIG. 6A), and a fourth surface 433 parallel to the third surface 431. At least one of the third plural components 911, 913 and 915 of the antenna device 900 (e.g., antenna device 400 in FIG. 6A) may also be disposed on the fourth surface 433. For example, the third plural components 911, 913 and 915 that may be included in the antenna device 900, such as a circuit for controlling the power of the antenna device 900, a component for receiving the signal received through the antenna patterns 411-*a* and 411-*b*, and a communication circuit 913 for controlling the radiation of the signal of the antenna pattern, may be disposed on the fourth surface 433 of the second circuit board 430.

Figure 10A:
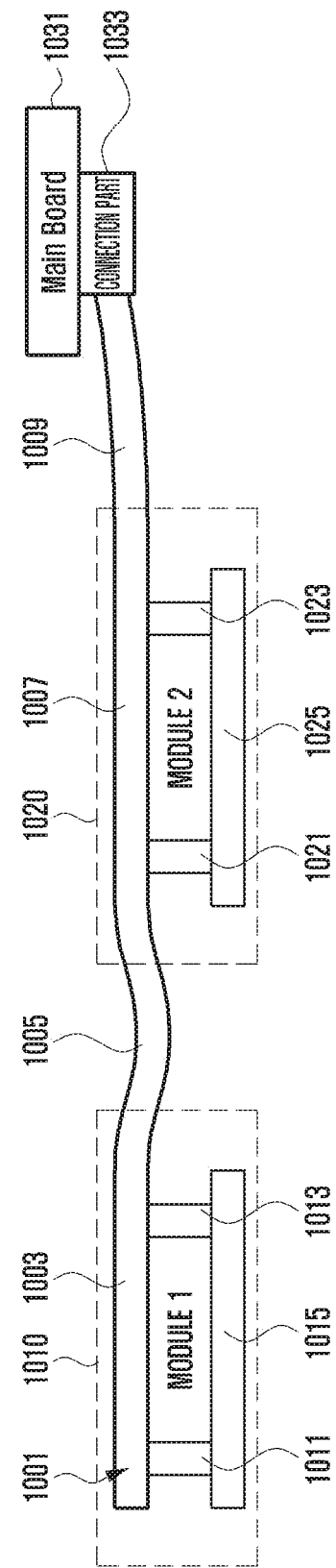
FIG. 10A illustrates an antenna device implemented by interconnecting multiple modules according to an embodiment of the disclosure.
Figure 10B:
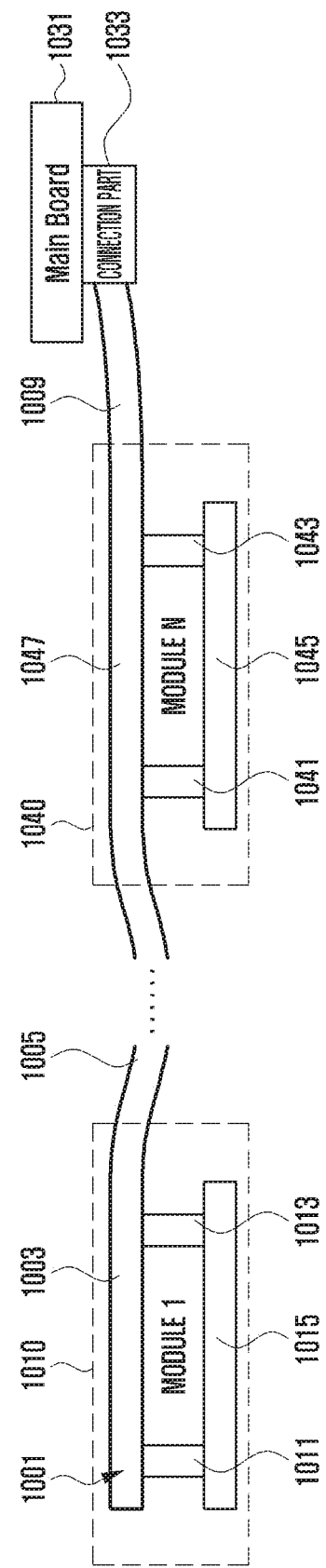
FIG. 10B illustrates an antenna device implemented by interconnecting multiple modules according to an embodiment of the disclosure.

FIGS. 10A and 10B illustrate an antenna device implemented by interconnecting multiple modules according to various embodiments of the disclosure.

The modules constituting the antenna device (e.g., the antenna device 400 in FIG. 4A, or antenna device 500 in FIG. 5A) according to various embodiments of the disclosure may be implemented to share one board, and one antenna module may be electrically connected to another antenna module.

Referring to FIG. 10A, among a first circuit board 1003 and a second circuit board 1015 of a first antenna module 1010, a section of the circuit board implemented using a RFPCB or a hot bar (e.g., flexible area of the circuit board implemented using a RFPCB, or soldered signal lines of the circuit board implemented using a hot bar) may be connected to the second antenna module 1020.

Among the first circuit board and the second circuit board of the second antenna module 1020, a section of the circuit board implemented using a RFPCB or a hot bar (e.g., flexible area of the circuit board implemented using a RFPCB, or soldered signal lines of the circuit board implemented using a hot bar) may be connected to the first antenna module 1010. The first antenna module 1010 may include a first circuit board 1003 on which antenna patterns (not shown) are arranged, and a second circuit board 1015 electrically connected to the first circuit board 1003 through a first interposer 1011 and a second interposer 1013.

In various embodiments of the disclosure, among the third circuit board 1007 and the fourth circuit board 1025 of the second antenna module 1020, another section of the circuit board implemented using a RFPCB or a hot bar (e.g., flexible area of the circuit board implemented using a RFPCB, or soldered signal lines of the circuit board implemented using a hot bar) may be electrically connected to the connection part 1033 of the main board 1031. The second antenna module 1020 may include the third circuit board 1007 on which antenna patterns (not shown) are disposed, and the fourth circuit board 1025 electrically connected to the third circuit board 1007 through a third interposer 1021 and a fourth interposer 1023.

In various embodiments of the disclosure, the first antenna module 1010 and the second antenna module 1020 may be implemented by using one RFPCB 1001. The first circuit board 1003 and the third circuit board 1007 may have rigidity, and the first circuit board 1003 and the third circuit board 1007 may be electrically connected through the first flexible area 1005. The antenna pattern (not shown) included in the first antenna module 1010 may be disposed on the first circuit board 1003, and the antenna pattern (not shown) included in the second antenna module 1020 may be disposed on the third circuit board 1007. The first antenna module 1010 and the second antenna module 1020 may be electrically connected through the first flexible area 1005. The second antenna module 1020 can be electrically connected to the connection part 1033 of the main board 1031 through the second flexible area 1009.

Referring to FIG. 10B, an example of an antenna device implemented by interconnecting multiple antenna modules (e.g., N antenna modules) as an enlarged view of the antenna modules shown in FIG. 10A is illustrated. Among the first circuit board and the second circuit board of the N-th antenna module 1040, another section of the circuit board implemented using a RFPCB or a hot bar (e.g., flexible area of the circuit board implemented using a RFPCB, or soldered signal lines of the circuit board implemented using a hot bar) may be electrically connected to the connection part 1033 of the main board 1031.

In various embodiments of the disclosure, the first antenna module 1010 may include a first circuit board 1003 on which an antenna pattern (not shown) is disposed, and a second circuit board 1015 electrically connected to the first circuit board 1003 through a first interposer 1011 and a second interposer 1013. The N-th antenna module 1020 may include a third circuit board 1047 on which an antenna pattern (not shown) is disposed, and a fourth circuit board 1045 electrically connected to the third circuit board 1047 through a fifth interposer 1041 and a sixth interposer 1043.

In various embodiments of the disclosure, the N antenna modules can be interconnected in a cascade way. At least some of the multiple antenna modules may include components of the antenna device, and some other of the antenna modules may include only antenna patterns. In this case, the components included in one antenna module may be used by another antenna module.

Figure 11A:
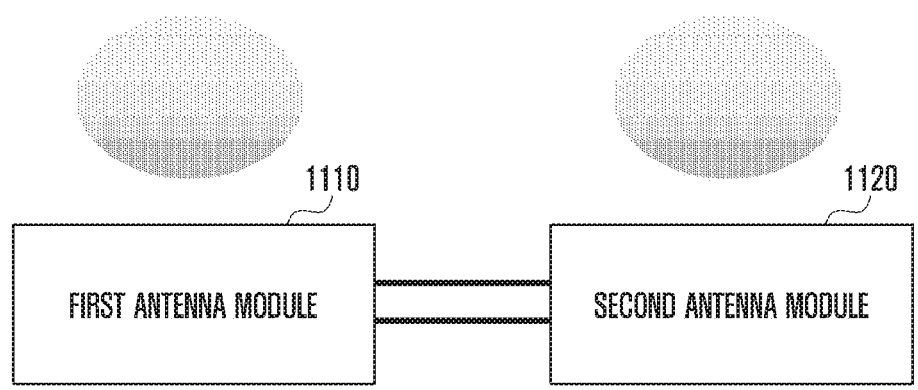
FIG. 11A illustrates an antenna device whose modules are interconnected in consideration of a radiation direction according to an embodiment of the disclosure.
Figure 11B:
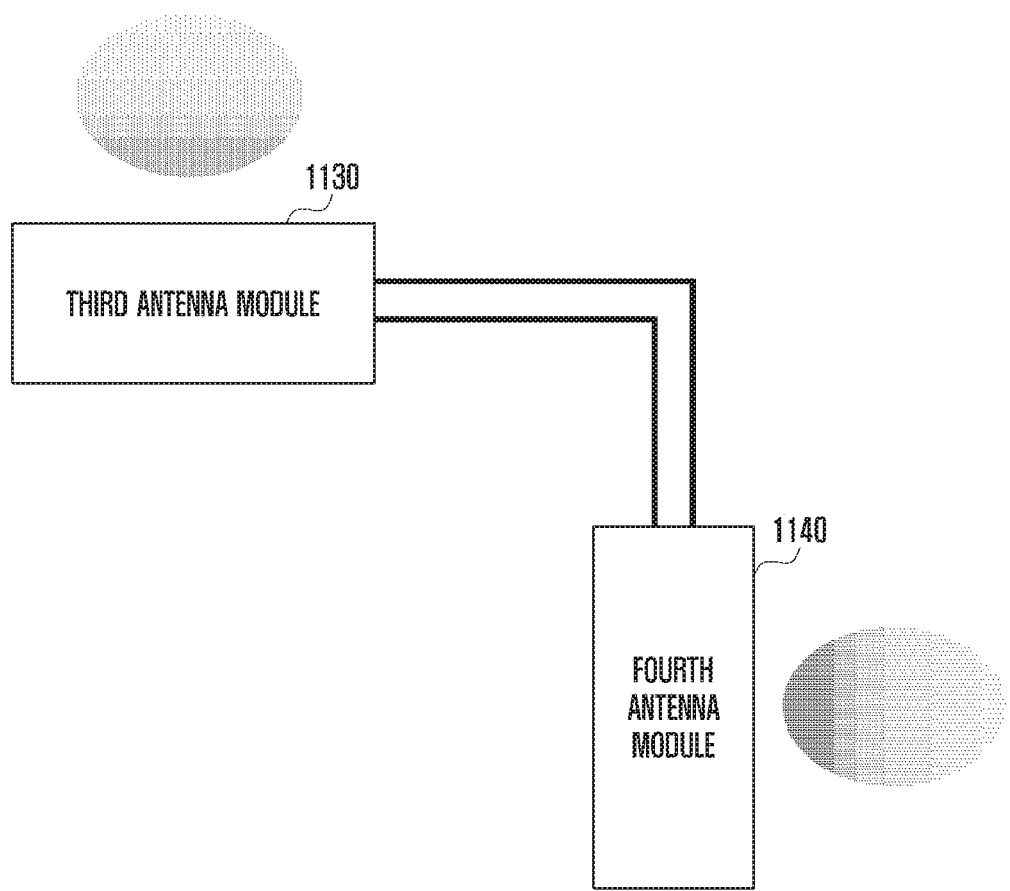
FIG. 11B illustrates an antenna device whose modules are interconnected in consideration of a radiation direction according to an embodiment of the disclosure.
Figure 11C:
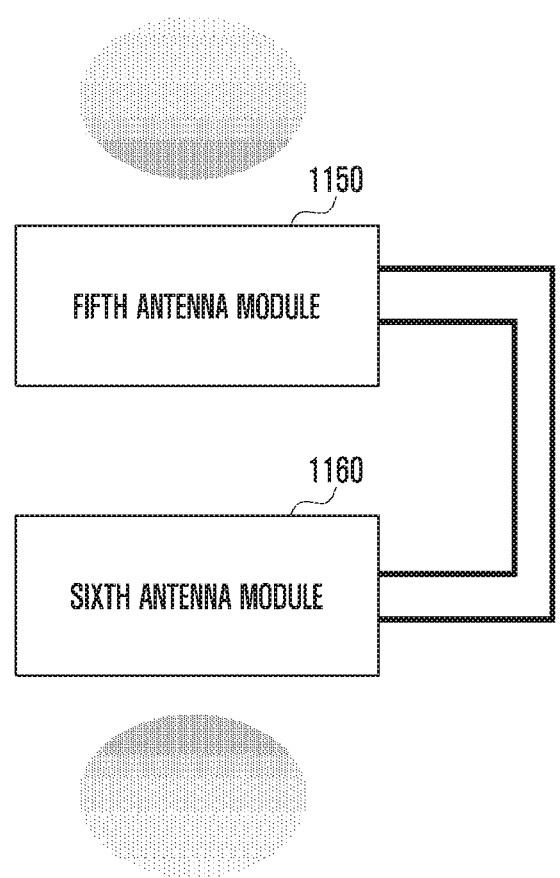
FIG. 11C illustrates an antenna device whose modules are interconnected in consideration of a radiation direction according to an embodiment of the disclosure.

FIGS. 11A to 11C illustrate an antenna device whose modules are interconnected in consideration of a radiation direction according to various embodiments of the disclosure.

In various embodiments of the disclosure, the N antenna modules can be electrically interconnected in various forms according to the signal radiation direction intended by the designer. FIGS. 11A to 11C show examples in which some of the N antenna modules (e.g., two antenna modules) are arranged according to the intended signal radiation direction.

Referring to FIG. 11A, the first antenna module 1110 and the second antenna module 1120 are arranged in parallel. The first antenna module 1110 and the second antenna module 1120 arranged in parallel can radiate signals in the same direction. The arrangement of the first antenna module 1110 and the second antenna module 1120 shown in FIG. 11A may be for radiating signals in the same direction.

Referring to FIG. 11B, the third antenna module 1130 and the fourth antenna module 1140 are arranged in a vertical direction. The third antenna module 1130 and the fourth antenna module 1140 may be arranged at a preset angle (e.g., 90 degrees). The signals emitted by the third antenna module 1130 and the fourth antenna module 1140 may make a specific angle (e.g., 90 degrees).

Referring to FIG. 11C, the fifth antenna module 1150 and the sixth antenna module 1160 are arranged so that the signals radiated by them form a specific angle (e.g., 180 degrees). The signals emitted by the fifth antenna module 1150 and the sixth antenna module 1160 may make a specific angle (e.g., 180 degrees).

Figure 12:
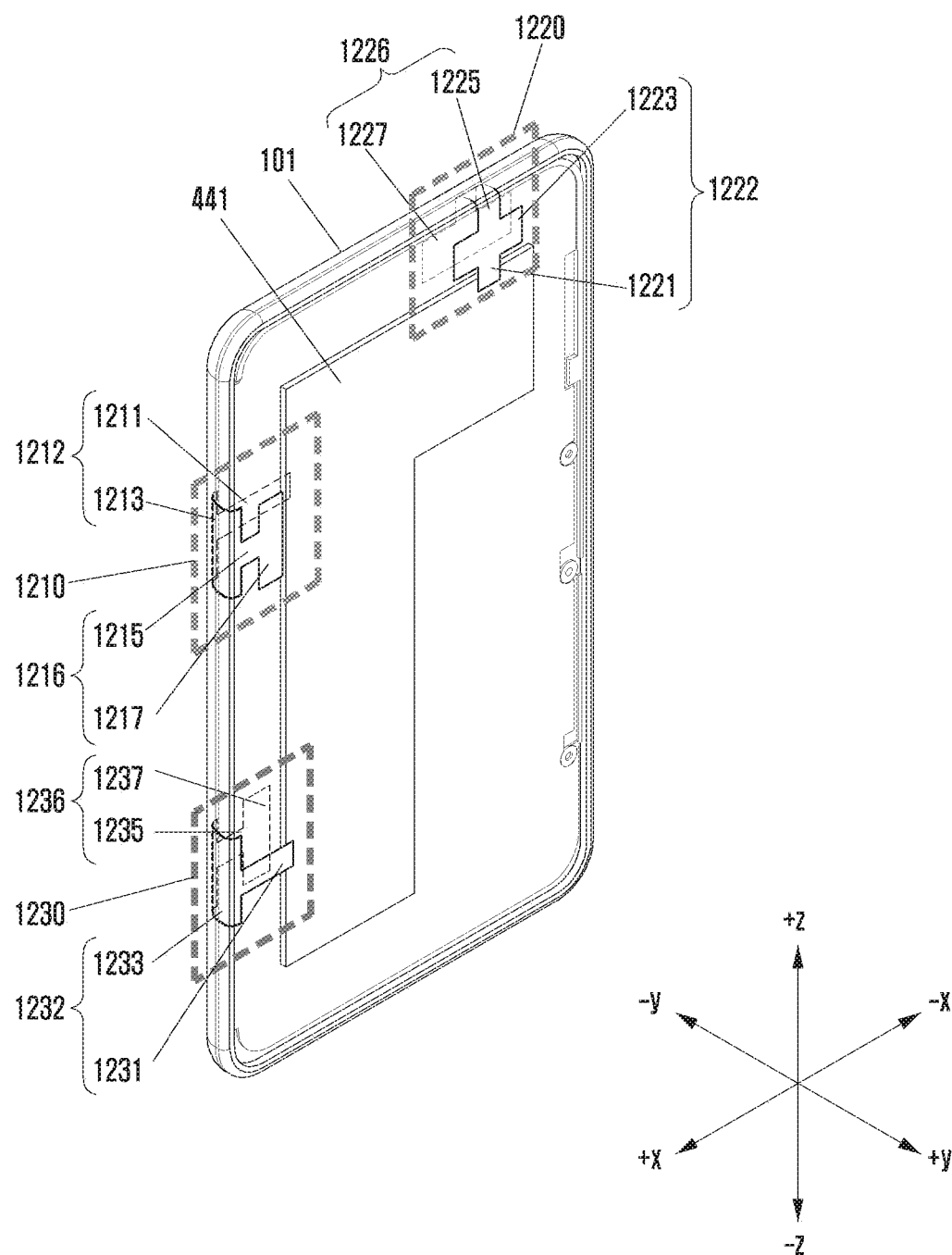
FIG. 12 illustrates an antenna device being realized in an electronic device according to an embodiment of the disclosure.

FIG. 12 illustrates an antenna device being realized in an electronic device according to an embodiment of the disclosure.

Referring to FIG. 12, the electronic device (e.g., electronic device 101 in FIG. 1) according to various embodiments of the disclosure may include a main board (e.g., the main board 441 in FIG. 4A), a first antenna device 1210 (e.g., antenna device 400 in FIG. 4A, or antenna device 500 in FIG. 5A), a second antenna device 1220 (e.g., antenna device 400 in FIG. 4A, or antenna device 500 in FIG. 5A), and a third antenna device 1230 (e.g., antenna device 400 in FIG. 4A, or antenna device 500 in FIG. 5A).

In various embodiments of the disclosure, various components included in the electronic device 101 (e.g., memory 130, processor 120, power management module 188, display 160, and communication module 190 of FIG. 1) can be mounted on the main board 441. The main board 441 may be electrically connected to at least one of the first antenna device 1210, the second antenna device 1220, or the third antenna device 1230. The first antenna device 1210, the second antenna device 1220 and the third antenna device 1230 may emit or receive a communication signal under the control of the communication module 190 mounted on the main board 441.

In various embodiments of the disclosure, the first antenna device 1210, the second antenna device 1220, and the third antenna device 1230 may include the antenna device implemented using a RFPCB or a hot bar described in FIGS. 4A to 4E, 5A, 5B, 6A, 6B, 7A, 7B, 8 and 9.

In various embodiments of the disclosure, the first antenna device 1210 may have a configuration in which two antenna modules are connected as in the embodiment shown in FIG. 11B. The first antenna device 1210 may include a first antenna module 1212 that radiates signals in the +x direction, and a second antenna module 1216 that radiates signals in the +y direction. The first antenna module 1212 may include a rigid area 1213 in which an antenna pattern for radiating signals in the +x direction is disposed, and a flexible area 1211 electrically connected to the main board 441. The first antenna module 1212 may include a dipole antenna emitting a signal in the +y direction or in the −y direction. The second antenna module 1216 may include a rigid area 1217 in which an antenna pattern for radiating a signal in the +y direction is disposed, and a flexible area 1215 electrically connected to the rigid area 1213 of the first antenna module 1212.

In various embodiments of the disclosure, the second antenna device 1220 may have a configuration in which two antenna modules are connected as in the embodiment shown in FIG. 11B. The second antenna device 1220 may include a third antenna module 1222 that emits a signal in the +y direction, and a fourth antenna module 1226 that emits a signal in the −y direction. The third antenna module 1222 may include a rigid area 1223 in which a patch antenna radiating a signal in the +y direction is disposed, and a flexible area 1221 electrically connected to the main board 441. The third antenna module 1222 may include a dipole antenna radiating a signal in the +z direction.

The fourth antenna module 1226 may include a rigid area 1227 in which an antenna pattern for radiating signals in the −y direction is disposed, and a flexible area 1225 electrically connected to the rigid area 1223 of the third antenna module 1222.

In various embodiments of the disclosure, the third antenna device 1230 may have a configuration in which two antenna modules are connected as in the embodiment shown in FIG. 11B. The third antenna device 1230 may include a fifth antenna module 1232 that radiates signals in the +x direction, and a sixth antenna module 1236 that radiates signals in the −y direction. The fifth antenna module 1232 may include a rigid area 1233 in which an antenna pattern radiating signals in the +x direction is disposed, and a flexible area 1231 electrically connected to the main board 441. The fifth antenna module 1232 may include a dipole antenna radiating a signal in the +y direction or in the −y direction. The sixth antenna module 1236 may include a rigid area 1237 in which an antenna pattern radiating signals in the −y direction is disposed, and a flexible area 1235 electrically connected to the rigid area 1233 of the fifth antenna module 1232. The sixth antenna module 1232 may further include an antenna pattern radiating a signal in a different direction.

In various embodiments of the disclosure, the first antenna device 1210, the second antenna device 1220, and the third antenna device 1230 shown in FIG. 12 may face at least one of a plurality of planes (e.g., XY plane, YZ plane, and XZ plane). At least one of the first antenna device 1210, the second antenna device 1220, or the third antenna device 1330 may include a communication module (e.g., communication module 190 in FIG. 1). Although not shown in FIG. 12, the communication module 190 may be arranged so as to face one plane. For example, if the communication module 190 is included in the second antenna device 1220, it may be arranged to face the XZ plane.

Figure 13A:
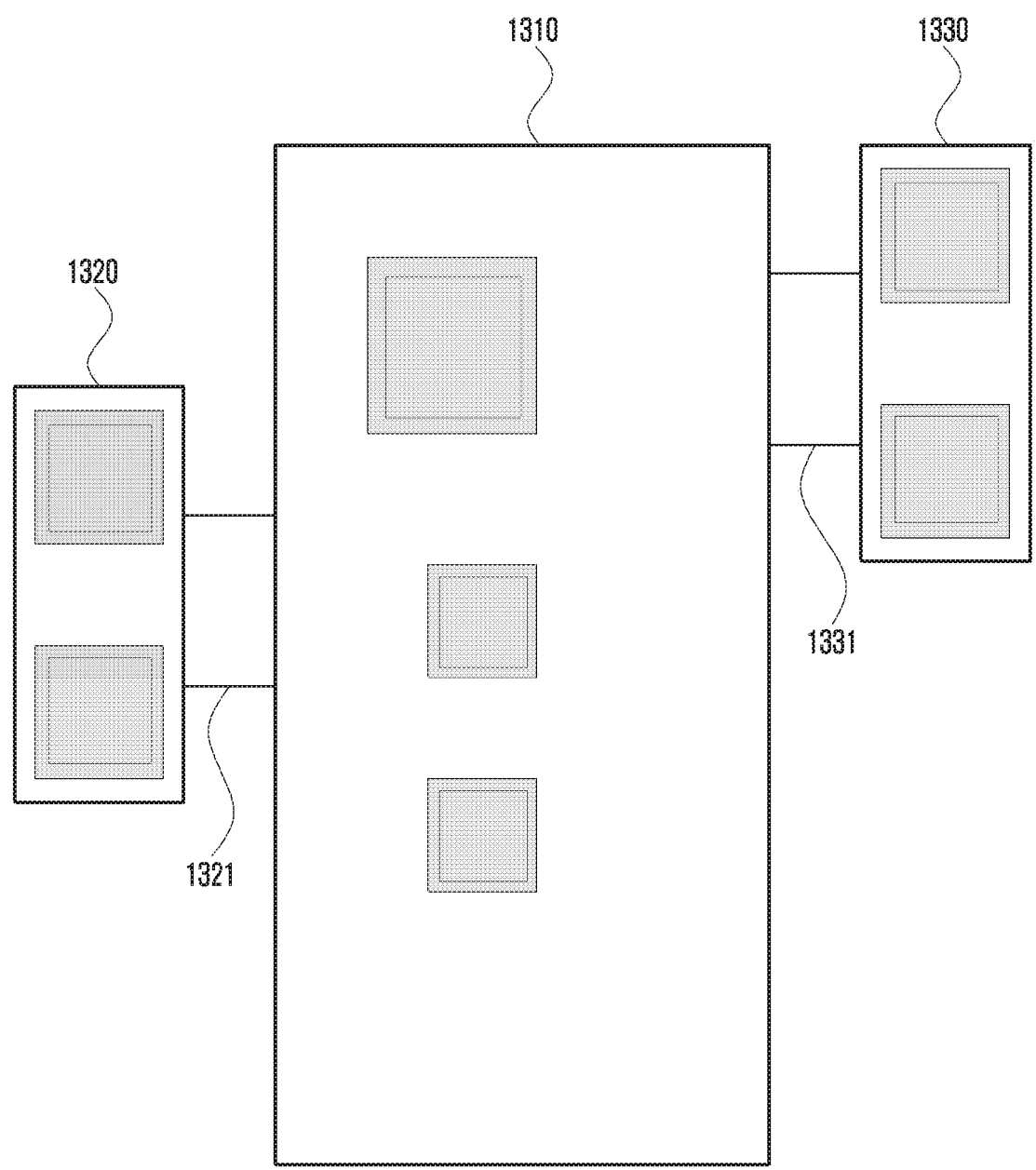
FIG. 13A illustrates an antenna device being connected to a main board according to an embodiment of the disclosure.
Figure 13B:
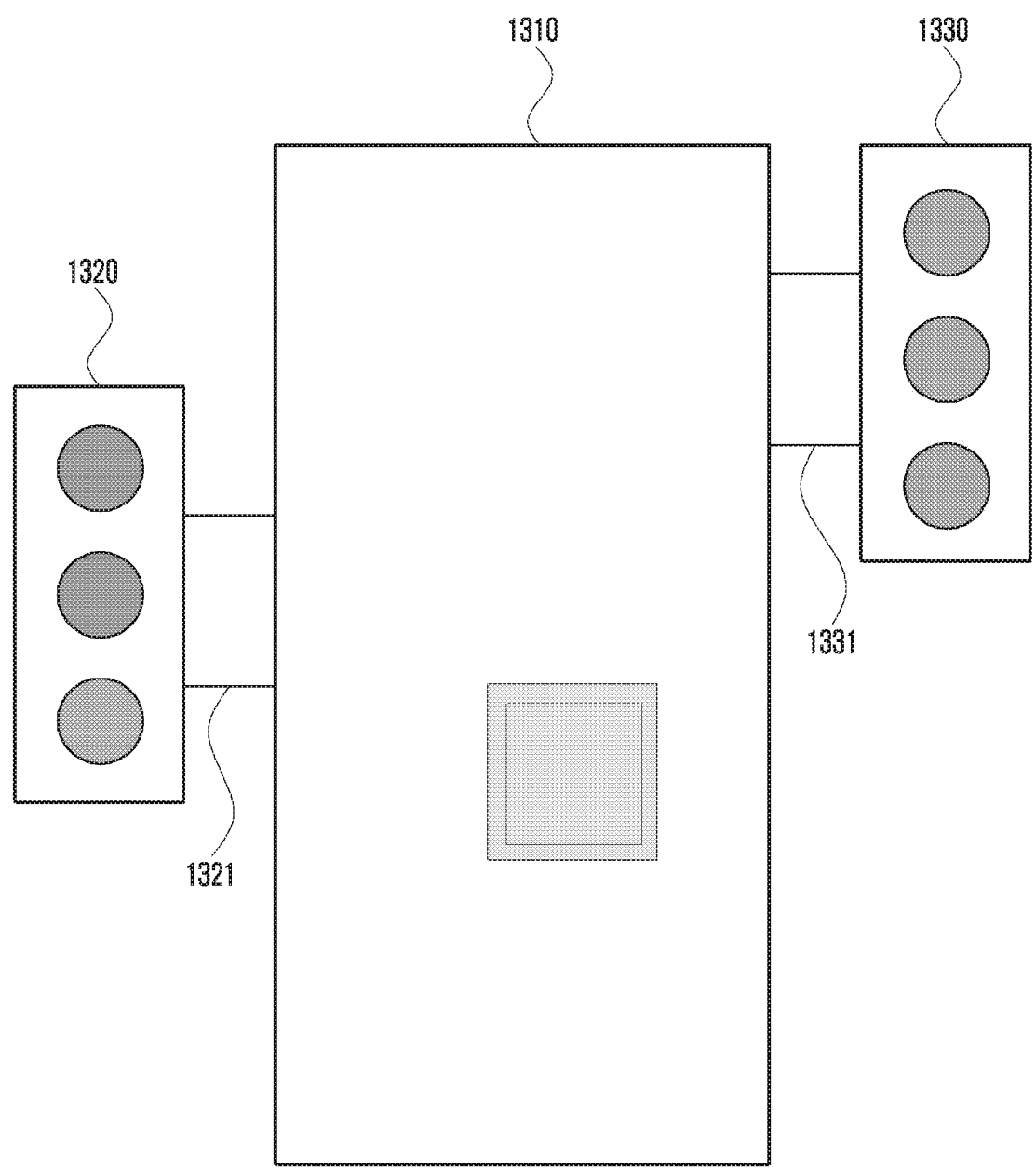
FIG. 13B illustrates an antenna device being connected to a main board according to an embodiment of the disclosure.

FIGS. 13A and 13B illustrate an antenna device being connected to a main board according to various embodiments of the disclosure. FIG. 13A is a top view of the antenna device, and FIG. 13B is a bottom view of the antenna device.

Referring to FIGS. 13A and 13B, antenna devices 1320 and 1330 according to various embodiments of the disclosure may be electrically connected to the main board (e.g., main mode 441 in FIG. 4A) 1310.

In various embodiments of the disclosure, a plurality of components included in the antenna devices 1320 and 1330 may be implemented on a circuit board. The circuit board included in the antenna devices 1320 and 1330 may be implemented using a RFPCB. The RFPCB may include a rigid area (e.g., rigid area 410 in FIG. 4A) that is hard and non-bendable, and a flexible areas 1321 and 1331 (e.g., flexible area 420 in FIG. 4A) that is ductile and flexibly bent. At least one of the first plural components may be mounted in the rigid area 410, and the flexible area 420 may be electrically connected to the rigid area 410. In various embodiments of the disclosure, at least one of the antenna patterns of the antenna device 1320 or 1330 (e.g., antenna patterns 411-*a* and 411-*b* in FIG. 4A) or the plural components of the antenna device 1320 or 1330 may be arranged in the rigid area 410. In various embodiments of the disclosure, a section of the flexible areas 1321 and 1331 may be electrically connected to another board. For example, a section of the flexible areas 1321 and 1331 may be electrically connected to the connection part of the main board 1310 on which the components of the electronic device (e.g., electronic device 101 in FIG. 1) are mounted.

In various embodiments of the disclosure, the antenna device 400 whose circuit board is implemented using a RFPCB may not have a separate connection part (e.g., first connection part 237 in FIG. 2, or first connection part 341 in FIG. 3) and thus can save the space occupied by the connection part. In addition, it is possible to reduce the noise of a signal that may be caused by the connection part.

Referring to FIGS. 13A and 13B, a plurality of components may be arranged on the main board 1310 and the top and bottom of the antenna device 1320 or 1330. Examples of the components being arranged and their arrangements are described above with reference to FIGS. 4A, 4B, 4C, 4D and 4E.

Figure 14A:
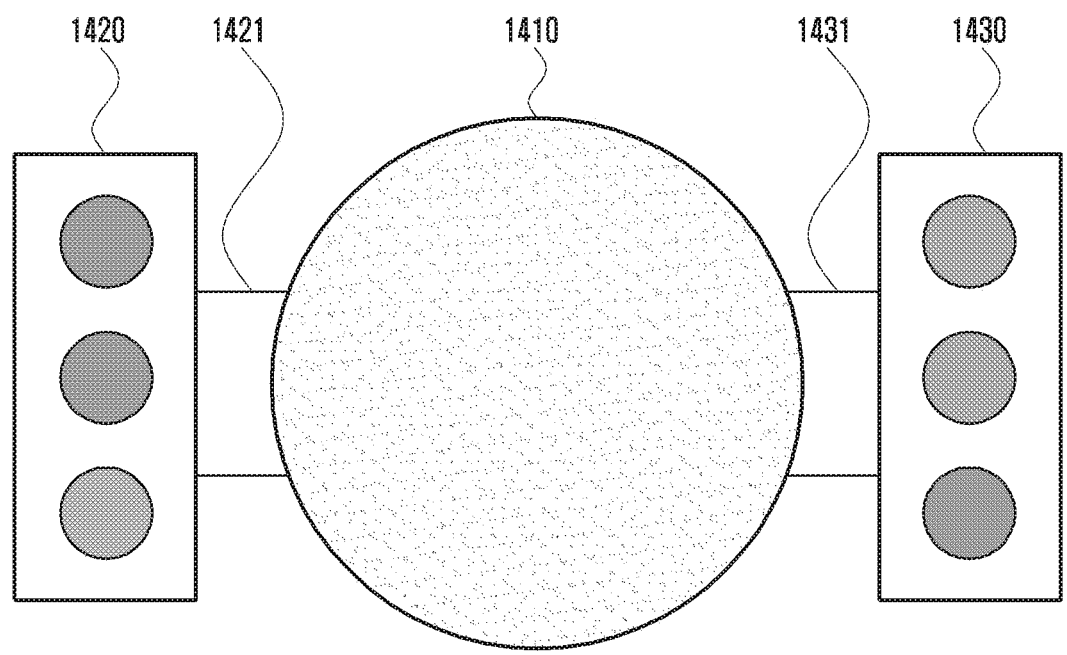
FIG. 14A illustrates an antenna device being connected to a main board according to an embodiment of the disclosure.
Figure 14B:
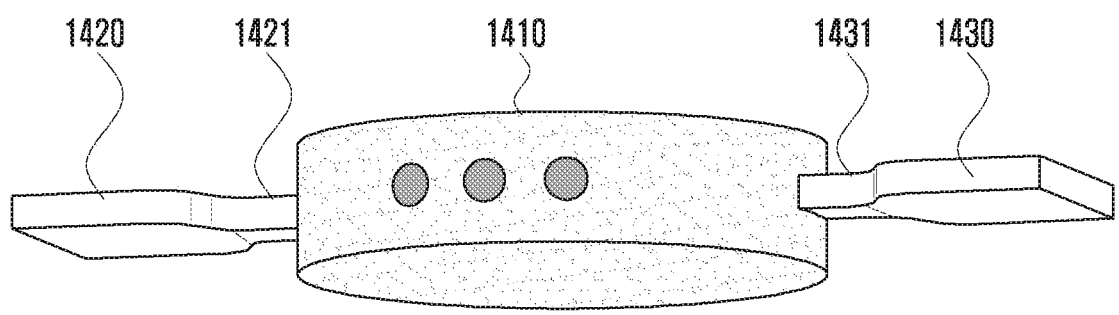
FIG. 14B illustrates an antenna device being connected to a main board according to an embodiment of the disclosure.

FIGS. 14A and 14B illustrate an antenna device being connected to a main board according to various embodiments of the disclosure. FIG. 14A is a top view of the antenna device, and FIG. 14B is a front view of the antenna device.

Referring to FIGS. 14A and 14B, antenna devices 1420 and 1430 according to various embodiments of the disclosure may be electrically connected to the main board (e.g., main board 441 in FIG. 4A) 1410.

In various embodiments of the disclosure, a plurality of components included in the antenna devices 1420 and 1430 may be implemented on a circuit board. The circuit board included in the antenna devices 1420 and 1430 may be implemented using a RFPCB. The RFPCB may include a rigid area (e.g., rigid area 410 in FIG. 4A) that is hard and non-bendable, and a flexible area 1421 or 1431 (e.g., flexible area 420 in FIG. 4A) that is ductile and flexibly bent. At least one of the first plural components may be mounted in the rigid area 410, and the flexible area 420 may be electrically connected to the rigid area 410. In various embodiments of the disclosure, at least one of the antenna patterns of the antenna device 1420 or 1430 (e.g., antenna patterns 411-*a* and 411-*b* in FIG. 4A) or the plural components of the antenna device 1420 or 1430 may be arranged in the rigid area. In various embodiments of the disclosure, a section of the flexible area 1421 or 1431 may be electrically connected to another board. For example, a section of the flexible area 1421 or 1431 may be electrically connected to the connection part of the main board 1410 on which the components of the electronic device (e.g., electronic device 101 in FIG. 1) are mounted.

In various embodiments of the disclosure, the antenna device 400 whose circuit board is implemented using a RFPCB may not have a separate connection part (e.g., first connection part 237 in FIG. 2, or first connection part 341 in FIG. 3) and thus can save the space occupied by the connection part. In addition, it is possible to reduce the noise of a signal that may be caused by the connection part.

Referring to FIGS. 14A and 14B, a plurality of components may be arranged on the main board 1410 and the top and front of the antenna device 1420 or 1430. Examples of the components being arranged and their arrangements are described above with reference to FIGS. 4A, 4B, 4C, 4D and 4E.

According to various embodiments of the disclosure, the electronic device may include: a housing (e.g., housing 490 in FIG. 4A) that includes a first plate (e.g., first plate 493 in FIG. 4A), a second plate (e.g., second plate 491 in FIG. 4A) facing the opposite direction of the first plate 493, and a side member (e.g., side member 495 in FIG. 4A) surrounding the space between the first plate 493 and the second plate 493, a display (e.g., display 160 in FIG. 1) viewable through at least a portion of the first plate 493, an antenna assembly (e.g., antenna device 400 in FIG. 4A) disposed within the housing 490, wherein the antenna assembly includes a first printed circuit board (e.g., first circuit board 401) having a first surface (e.g., first surface 403 of FIG. 4A) facing a first direction and a second surface (e.g., second surface 405 in FIG. 4A) facing a second direction opposite to the first direction, a second printed circuit board (e.g., second circuit board 430 in FIG. 4A) spaced apart from the first circuit board 401 and having a third surface (e.g., third surface 431 in FIG. 4A) facing the first direction and facing at least a portion of the second surface 405 and a fourth surface (e.g., fourth surface 433 in FIG. 4A) facing the second direction, at least one structure (e.g., interposer 419-*a* or 419-*b* in FIG. 4A) interconnecting the first printed circuit board 401 and the second printed circuit board 430 and having conductive paths, a plurality of conductive patterns 410 (e.g., antenna pattern 411 in FIG. 4A) formed at least on the first surface 403, on the fourth surface 433, inside the first printed circuit board 401, or inside the second printed circuit board 430, and a wireless communication circuit mounted on at least one of the second surface 405 or the third surface 431 and configured to transmit and receive a signal having a frequency between 3 GHz and 100 GHz, a flexible printed circuit board (e.g., flexible area 420 in FIG. 4A) extended from one end of the first printed circuit board 401 or one end of the second printed circuit board 430, and a third printed circuit board (e.g., main board 441 in FIG. 4A) having a connector (e.g., connection part 443 in FIG. 4A) electrically connected to the wireless communication circuit through the flexible printed circuit board and disposed between the first plate 493 and the second plate 491 in parallel with the first plate 491.

In various embodiments of the disclosure, the first printed circuit board 401 may be disposed substantially parallel to the first plate 493 and may be placed between the second printed circuit board 430 and the second plate 491.

In various embodiments of the disclosure, the flexible printed circuit board 420 may be extended from one end of the first printed circuit board 401.

In various embodiments of the disclosure, the flexible printed circuit board 420 may be extended from one end of the second printed circuit board (e.g., second printed circuit board 520 in FIG. 5A).

In various embodiments of the disclosure, the first printed circuit board 420 may be disposed substantially perpendicular to the first plate 493 and may be placed between the second printed circuit board 430 and a portion of the side member 495.

In various embodiments of the disclosure, the flexible printed circuit board 420 may be extended from one end of the first printed circuit board (e.g., first printed circuit board 410 in FIG. 4E).

In various embodiments of the disclosure, the flexible printed circuit board 420 may be extended from one end of the second printed circuit board (e.g., second printed circuit board 520 in FIG. 5B).

In various embodiments of the disclosure, the plurality of conductive patterns 411 may include at least one conductive pattern (e.g., fourth antenna pattern 710 in FIG. 7A) disposed on the edge of the first printed circuit board (e.g., first printed circuit board 401 in FIG. 7A) and constituting a dipole antenna.

In various embodiments of the disclosure, the plurality of conductive patterns 411 may include at least one conductive pattern (e.g., third antenna pattern 610 in FIG. 6A) disposed on the edge of the second printed circuit board (e.g., second printed circuit board 610 in FIG. 6A) and constituting a dipole antenna.

In various embodiments of the disclosure, the plurality of conductive patterns 411 may constitute a dipole antenna (e.g., a third antenna pattern 610 of FIG. 6A, a fourth antenna pattern 710 of FIG. 7A) and/or a patch antenna (e.g., antenna pattern 411 in FIG. 4A).

In various embodiments of the disclosure, the third printed circuit board 420 may further include a circuit (e.g., communication module 190 in FIG. 1) that is electrically connected to the wireless communication circuit through the connector 443 and is configured to transmit a signal having a frequency between 5 GHz and 25 GHz to the wireless communication circuit.

In various embodiments of the disclosure, the first circuit board 401 and the flexible printed circuit board 420 may be implemented using a RFPCB, the first circuit board 401 may be implemented using a rigid area of the RFPCB, and the flexible printed circuit board 420 may be implemented using a flexible area of the RFPCB.

In various embodiments of the disclosure, the second circuit board 520 and the flexible printed circuit board 527 may be implemented using a RFPCB, the second circuit board 520 may be implemented using a rigid area of the RFPCB, and the flexible printed circuit board 527 may be implemented using a flexible area of the RFPCB.

In various embodiments of the disclosure, the flexible printed circuit board 420 may be soldered to one end of the first printed circuit board or one end of the second printed circuit board.

In various embodiments of the disclosure, the electronic device may further include a plurality of conductive patterns (e.g., third antenna pattern 610 in FIG. 6A, and fourth antenna pattern 710 in FIG. 7A) formed on at least one of the side of the first circuit board or the side of the second circuit board.

According to various embodiments of the disclosure, the electronic device may include: at least two antenna modules including a first antenna module (e.g., first antenna module 1110 in FIG. 11A) and a second antenna module (e.g., second antenna module 1120 in FIG. 11A), and a main board 441 on which components of the electronic device are arranged, wherein the first antenna module 1110 may include a first circuit board 401 having a first surface 403 on which a first antenna pattern 411 is disposed and a second surface 405 facing a direction opposite to the first surface, a second circuit board 430 disposed in a direction facing the first surface 403, and at least one first interposer 419-a and 419-b disposed between the first circuit board 401 and the second circuit board 430 and electrically interconnecting the first circuit board 401 and the second circuit board 430, wherein the first circuit board 401 may be implemented using a RFPCB having a flexible area (flexible area 410) and a rigid area (rigid area 420), wherein the second antenna module 1120 may include a third circuit board 401 having a third surface 403 on which the second antenna pattern 411 is disposed and a fourth surface 405 facing a direction opposite to the third surface 403, a fourth circuit board 430 disposed in a direction facing the third surface 403, and at least one second interposer 419-a and 419-b disposed between the third circuit board 401 and the fourth circuit board 430 and electrically interconnecting the third circuit board 401 and the fourth circuit board 430, wherein the third circuit board 430 may be implemented using a RFPCB having a flexible area (flexible area 410) and a rigid area (rigid area 420), and wherein a portion of the flexible area of the first circuit board 401 may be electrically connected to the third circuit board 430 and a portion of the flexible area of the third circuit board may be connected to the main board 441.

In the electronic device according to various embodiments of the disclosure, the third circuit board 430 may be extended from one end of the first circuit board 401.

In the electronic device according to various embodiments of the disclosure, the first antenna pattern 411 and the second antenna pattern 411 may constitute at least one of a dipole antenna or a patch antenna.

In the electronic device according to various embodiments of the disclosure, the first antenna module 1110 may further include at least one of a third antenna pattern 710 disposed on the side of the first circuit board 401 or a fourth antenna pattern 610 disposed on the side of the second circuit board 430.

In the electronic device according to various embodiments of the disclosure, the second antenna module 1120 may further include at least one of a fifth antenna pattern 710 disposed on the side of the third circuit board 401 or a sixth antenna pattern 610 disposed on the side of the fourth circuit board 430.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment of the disclosure. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A portable communication device comprising:
   a housing including a front side, and a back side facing a direction opposite to the front side;
   a printed circuit board including a communication circuit and a first connector;
   a first antenna array including a first antenna and a second antenna disposed to face the front side such that signals from the first antenna are radiated in a direction corresponding to the front side; and
   a rigid flexible printed circuit board (RFPCB) including a rigid area and a flexible area, the RFPCB including a second connector configured to electrically connect with the printed circuit board by physically connecting to the first connector, the RFPCB being electrically connected between the first antenna array and the printed circuit board according to connection between the first connector and the second connector,
   wherein the first antenna and the second antenna are disposed above the rigid area of the RFPCB,
   wherein the flexible circuit includes a transmission line configured to transmit radio frequency (RF) signals generated by the communication circuit to the first antenna array, and
   wherein the RF signals has a frequency between 3GHz and 100GHz.

2. The portable communication device of claim 1, wherein the communication circuit is configured to transmit signals having a frequency range above 6 GHz to the first antenna array via the RFPCB.

3. The portable communication device of claim 2, wherein the transmission line of the RFPCB is configured for transmitting signals having the frequency range above 6GHz.

4. The portable communication device of claim 1, wherein the first antenna array is disposed adjacent to an upper portion of the front side of the housing.

5. The portable communication device of claim 1, wherein the first antenna array includes a plurality of conductive patch antennas.

6. A portable communication device comprising:
- a device enclosure having exterior surfaces including a front surface facing a first direction and a rear surface facing a second direction opposite to the first direction;
- a printed circuit board including a first connector;
- a communication module mounted on the printed circuit board;
- a first antenna array including a first antenna and a second antenna disposed to face the front side such that the first antenna and the second antenna radiate signals in the first direction; and
- a rigid flexible printed circuit board (RFPCB) including a rigid area and a flexible area, the RFPCB including a second connector configured to electrically connect with the printed circuit board by physically connecting to the first connector, the RFPCB being electrically connected between the first antenna array and the printed circuit board by connecting the first connector to the second connector, wherein the first antenna and the second antenna are disposed on the rigid area of the RFPCB, wherein radio frequency (RF) signals, having a frequency between 3GHz and 100GHz, generated by the communication module are transmitted to the first antenna array via the first connector of the printed circuit board and the second connector and transmission lines of the flexible area of the RFPCB.

7. The portable communication device of claim 6, wherein the transmission line is disposed on the flexible area of the RFPCB.

* * * * *